(12) United States Patent
Hamada et al.

(10) Patent No.: US 6,535,993 B1
(45) Date of Patent: Mar. 18, 2003

(54) TESTING APPARATUS FOR SEMICONDUCTOR MEMORY DEVICE

(75) Inventors: Mitsuhiro Hamada, Hyogo (JP); Jun Ohtani, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/464,768

(22) Filed: Dec. 16, 1999

(30) Foreign Application Priority Data

Jun. 8, 1999 (JP) .......................................... 11-160860

(51) Int. Cl.[7] .............................................. G06F 11/18
(52) U.S. Cl. ............................ 714/6; 714/42; 714/711; 714/718
(58) Field of Search ........................... 714/6, 42, 710, 714/711, 719, 718, 720; 365/200, 201

(56) References Cited

U.S. PATENT DOCUMENTS

| | | | | |
|---|---|---|---|---|
| 4,628,509 A | * | 12/1986 | Kawaguchi | .................. 714/711 |
| 4,639,915 A | * | 1/1987 | Bosse | .......................... 714/711 |
| 5,617,364 A | * | 4/1997 | Hatakeyama | .......... 365/185.09 |
| 5,715,253 A | * | 2/1998 | Kim et al. | ................... 714/711 |
| 5,732,029 A | * | 3/1998 | Lee et al. | .................... 365/200 |
| 5,983,374 A | * | 11/1999 | Todome et al. | ............. 714/711 |
| 6,425,095 B1 | * | 7/2002 | Yasui | ........................... 714/42 |

FOREIGN PATENT DOCUMENTS

| | | |
|---|---|---|
| JP | 5-325594 | 12/1993 |
| JP | 10107096 A | 4/1998 |

* cited by examiner

*Primary Examiner*—Scott Baderman
(74) *Attorney, Agent, or Firm*—McDermott, Will & Emery

(57) ABSTRACT

Row faulty bit storage memory corresponding to a spare row circuit and a column faulty bit storage memory corresponding to a spare column circuit are provided independently of each other, and faulty bits of these faulty bit storage memories are counted by a row faulty bit counter and a column faulty bit counter, respectively. Repairability of the faulty row and repairability of the faulty column are determined using the row faulty bit storage memory and the column faulty bit storage memory. A time required for determining repairability of the faulty bit of a semiconductor memory is reduced, and a storage capacity of the faulty bit storage memory is reduced.

13 Claims, 17 Drawing Sheets

(i) a-th ROW TEST (ii) c-th ROW TEST (iv) e-th ROW TEST

FAULTY BIT IN 4TH COLUMN IS NOT TAKEN INTO ROW-SIDE FAULTY BIT STORAGE MEMORY OWING TO DECISION OF "4" COLUMN REPAIR

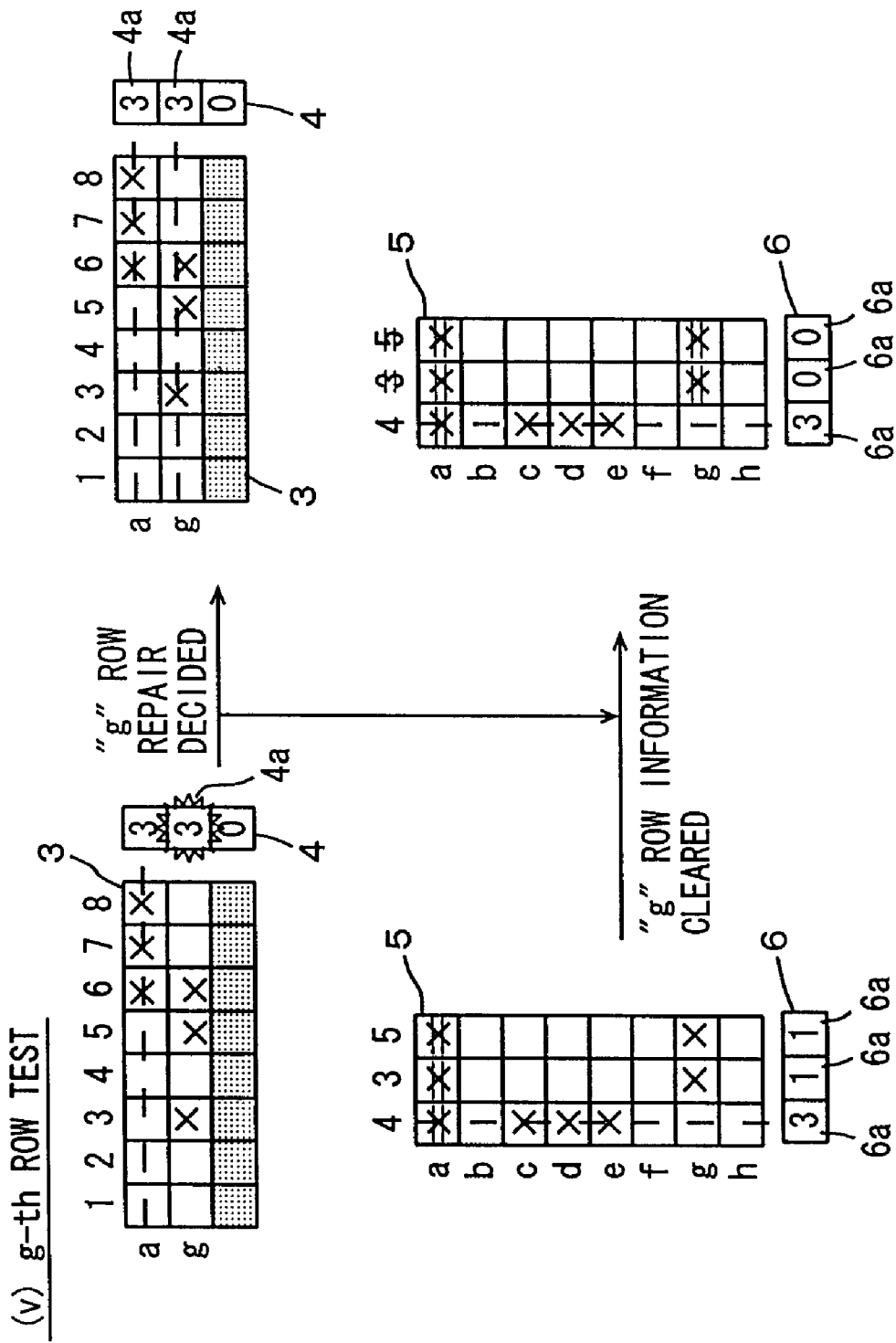

FIG. 11
(vi) h-th ROW TEST
ROW-SIDE FAULTY BIT STORAGE MEMORY CANNOT TAKE IN BECAUSE ALL ARE DECIDED FOR REPAIR
→ ROW SIDE FLAG "1"
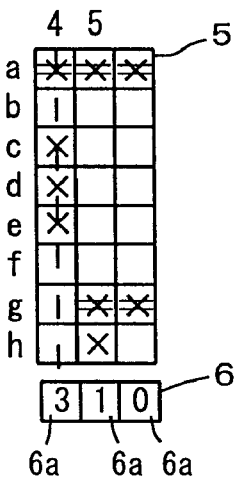
FIG. 12
(vii) TEST END
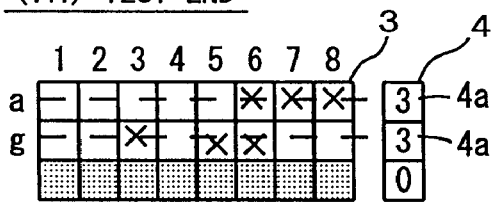
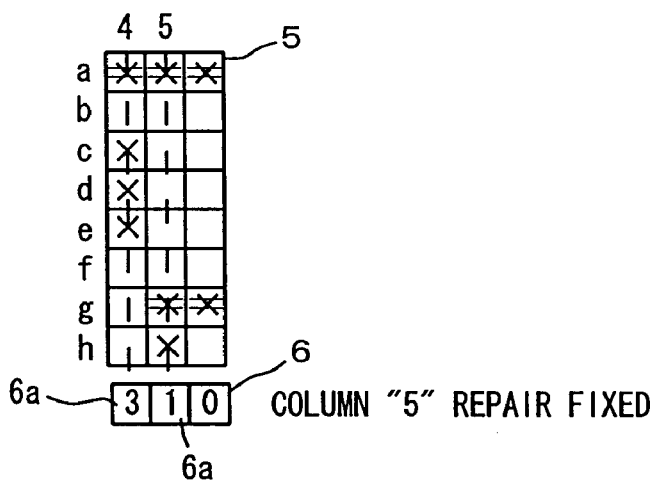
COLUMN "5" REPAIR FIXED

X : FAULTY BIT

TESTING APPARATUS FOR SEMICONDUCTOR MEMORY DEVICE

BACKGROUND OF THE INVENTION

1. Field of the Invention

The present invention relates to a semiconductor testing apparatus, and particularly a semiconductor testing apparatus for specifying a position of a faulty memory cell in a semiconductor memory device and determining whether it can be repaired by a redundant circuit or not.

2. Description of the Background Art

In view of product yield and others, a semiconductor memory device is generally provided internally with a redundant circuit so that a faulty portion (faulty memory cell) can be repaired by the redundant circuit. The redundant circuit, which will be referred to as a "spare circuit" hereinafter, is formed of a spare row (X) and a spare column (Y). A row or column in which a faulty memory cell (faulty bit) is present is replaced with the spare row or the spare column so that the faulty bit is repaired.

For repairing a faulty bit, a test is conventionally performed on a semiconductor memory device referred to as a "semiconductor memory" hereinafter, after wafer process of the semiconductor memory is completed. In this test, it is determined whether a faulty bit is present in the semiconductor memory or not. When a faulty bit is detected, it is determined whether the faulty bit can be repaired by the spare circuit or not.

FIG. 21 schematically shows a structure of a conventional semiconductor testing apparatus, which will be referred to as a "tester" hereinafter. In FIG. 21, a tester 102 includes a pattern generator 103 for generating a test pattern for a semiconductor memory under test 1, in accordance with a predetermined sequence to write the test pattern into semiconductor memory under test 1, a pass/fail determinator 104 for comparing data read from semiconductor memory under test 1 with an expected value to determine pass/fail of a read bit (memory cell), and a repairability determining device 105 for determining whether semiconductor memory under test 1 can be repaired or not, to detect a faulty address in accordance with the result of determination by pass/fail determinator 104.

FIG. 22 schematically shows a structure of repairability determining device 105 shown in FIG. 21. Semiconductor memory 1 includes a memory array 1a having memory cells arranged in rows and columns. FIG. 22 shows memory cell array 1a having the memory cells arranged in four rows and four columns.

Repairability determining device 105 includes a faulty bit storage memory 106 for storing a position of a faulty bit in memory array 1a of semiconductor memory 1, a row-side faulty bit counter 107 which includes count circuits arranged corresponding to respective rows of faulty bit storage memory 106, for counting the numbers of faulty bit(s) in the respective rows of faulty bit storage memory 106, and a column-side faulty bit counter 108 which includes count circuits arranged corresponding to the respective columns of faulty bit storage memory 106 for counting the numbers of faulty bit(s) in the respective columns.

Faulty bit storage memory 106 has storage capacity similar to that of memory array 1a of semiconductor memory 1, and can store information indicating a faulty bit, in the position determined as the faulty bit in accordance with the pass/fail determination result applied from pass/fail determinator 104. Operation of tester 102 and repairability determining device 105 shown in FIGS. 21 and 22. will now be described with reference to a flow chart of FIG. 23.

First, a test operation is effected on semiconductor memory under test 1 (step S1). In this test operation, pattern generator 103 first generates a predetermined test pattern in accordance with a predetermined sequence, and tester 102 writes the test pattern generated by pattern generator 103 into semiconductor memory under test 1 (step S1a).

Then, test pattern data is written into all the bits of semiconductor memory under test 1, and then the data is read from semiconductor memory under test 1. The data read from semiconductor memory under test 1 is applied to pass/fail determinator 104. Pass/fail determinator 104 is already supplied with expected values of the read data in accordance with the test pattern generated from pattern generator 103. Pass/fail determinator 104 makes a comparison between an expected value of data read from semiconductor memory under test 1 and a bit value of the data read from semiconductor memory 1, and determines whether the memory cell from which the data is read is a faulty bit or not in accordance with the result of comparison (step S1b).

When a faulty bit is present, pass/fail determinator 104 sends the faulty bit information to repairability determining device 105. Repairability determining device 105 stores the information indicating the fault at the position in faulty bit storage memory 106 corresponding to the position of the faulty bit in memory array 1a, in accordance with the faulty bit information sent from pass/fail determinator 104. Each of row-side and column-side faulty bit counters 107 and 108 increments the number of faulty bits on a corresponding row or column by one when faulty bit information is written into faulty bit storage memory 106 (step S2). This determining operation is repeated for all the bits of memory array 1a of the semiconductor memory under test (step S3).

In the flow chart of FIG. 23, it is shown that the testing process returns to step S1a of applying a new test pattern before the determination of all the bits is completed. This represents such a sequence that fault detection of all the bits is performed with a test pattern, and then another test pattern is applied to semiconductor memory under test 1 for performing detection of faulty bits in a similar manner. As the test patterns, there are various patterns such as a test pattern for detecting inter-bit interference and a test pattern formed of the same data for detecting the fault of a memory cell itself. These various test patterns are applied for detecting the faulty bit.

When the determination of all the bits of memory array 1a with all the test patterns is completed, repairability determining device 105 then determines the repairability (step S4). As shown in FIG. 22, it is now assumed that faulty bits are present at the 3rd column in the 1st and 2nd rows of memory array 1a when the determination of all the bits is completed. In this state, the count of each of the count circuits in the 1st and 2nd rows of row-side faulty bit counter 107 goes to 1 corresponding to the faulty bit and, in column-side faulty bit counter 108, the count of the count circuit corresponding to the 3rd column goes to 2. Based on the above distribution of faulty bits, it is determined whether the faulty bits can be repaired or not in accordance with a predetermined algorithm (not shown).

When it is determined that the repair is possible, programming of a faulty address is performed by fuse blow in the wafer process, and the faulty bit(s) are repaired by replacement with the spare row circuit(s) and/or spare column circuit(s).

For example, in the structure shown in FIG. 22, the 3rd column of memory array 1a is replaced with the spare column.

Faulty bit storage memory 106 has a storage capacity equal to or larger than the storage capacity of semiconductor memory under test 1 for storing the faulty bit positions of semiconductor memory under test 1. Repairability determining circuit 105 refers to faulty bit storage memory 106 for determining the repairability of a faulty bit. With increase in storage capacity of the semiconductor memory under test, therefore, the storage capacity of faulty bit storage memory 106 included in repairability determining circuit 105 must be increased, and the scale of repairability determining circuit 105 is increased. For increasing the storage capacity of the faulty bit storage memory, the memory must be extended, and the peripheral circuit structure must be changed for supporting the memory extension. Therefore, for every increase in storage capacity of the semiconductor memory under test, it is necessary to change the structure of repairability determining circuit 105 of tester 102, resulting in increase in cost of the testing apparatus.

In the prior art, the repairability is determined after reading data from all the bits of the semiconductor memory under test. Therefore, increase in storage capacity of the semiconductor memory under test results in increase in time required for reading data from the semiconductor memory under test and increase in time required for determination in pass/fail determinator 104. As a result, the test time increases.

SUMMARY OF THE INVENTION

An object of the invention is to provide a semiconductor testing apparatus which can remarkably reduce a capacity of a faulty bit storage memory.

Another object of the invention is to provide a semiconductor testing apparatus which can reduce a test time.

Still another object of the invention is to provide an inexpensive semiconductor testing apparatus which can efficiently determine repairability of a semiconductor memory.

A semiconductor testing apparatus according to the invention includes a row faulty bit storage memory for storing a faulty cell position in a row address of a semiconductor memory under test; and a column faulty bit storage memory arranged independently of the row faulty bit storage memory for storing a faulty cell position in a column address of the semiconductor memory under test.

Since the faulty bit storage memories for the row and column addresses which are employed for determining the repairability are arranged independently of each other, the faulty bit information on a row basis and the faulty bit information on a column basis can be stored independently of each other when the test data is read from the semiconductor memory under test, and it is not necessary to store the pass/fail information of all the bits of the semiconductor memory under test. Accordingly, storage capacities of the faulty bit storage memories can be reduced.

Further, it is possible to determine the repairability in parallel with the operation of storing the faulty bit information of the test target semiconductor device into the faulty bit storage memory, and the test time can be reduced as compared with a method in which the repairability is determined after the data reading of all the bits of the semiconductor memory under test.

By monitoring the faulty bits on the row basis and the column basis, it is possible to detect the numbers of spare row circuit(s) and spare column circuit(s) to be used, and therefore the repairability of the semiconductor memory under test can be determined. The test time can be reduced by stopping the testing of the semiconductor memory device under test immediately when the fault repairing is determined to be impossible.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 8 to 11 schematically show the internal states of the repairability determining device in the first embodiment of the invention;

FIG. 12 schematically shows the internal state of the repairability determining device at the time of end of the test;

DESCRIPTION OF THE PREFERRED EMBODIMENTS

[First Embodiment]

Figure 1:
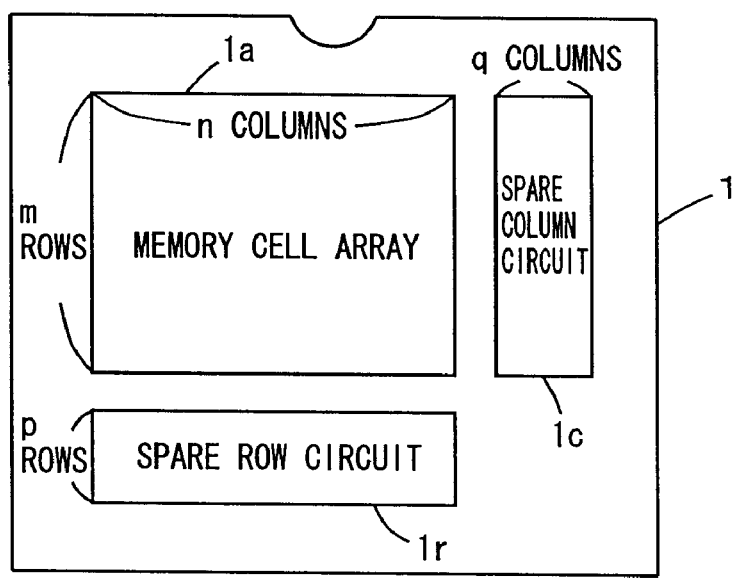
FIG. 1 schematically shows a structure of a semiconductor memory used in the embodiment of the present invention.

FIG. 1 schematically shows a structure of an array of a semiconductor memory to be tested by a semiconductor testing apparatus according to the invention. In FIG. 1, a semiconductor memory under test 1 includes a memory cell array 1a having memory cells arranged in m rows and n columns, a spare row circuit 1r for repairing a faulty row in memory cell array 1a, and a spare column circuit 1c for repairing a faulty column in memory cell array 1a. Spare row circuit 1r has memory cells arranged in p rows and n columns, and can repair faulty rows of p in number in memory cell array 1a, where p is smaller than m.

Spare column circuit 1c has memory cells arranged in m rows and q columns, and can repair faulty columns of q in number in memory cell array 1a, where q is smaller than n. Spare row circuit 1r and spare column circuit 1c each may be arranged distributedly in memory cell array 1a. As a redundant circuit, semiconductor memory 1 is merely required to have a structure which can repair p faulty rows and q faulty columns.

Figure 2:
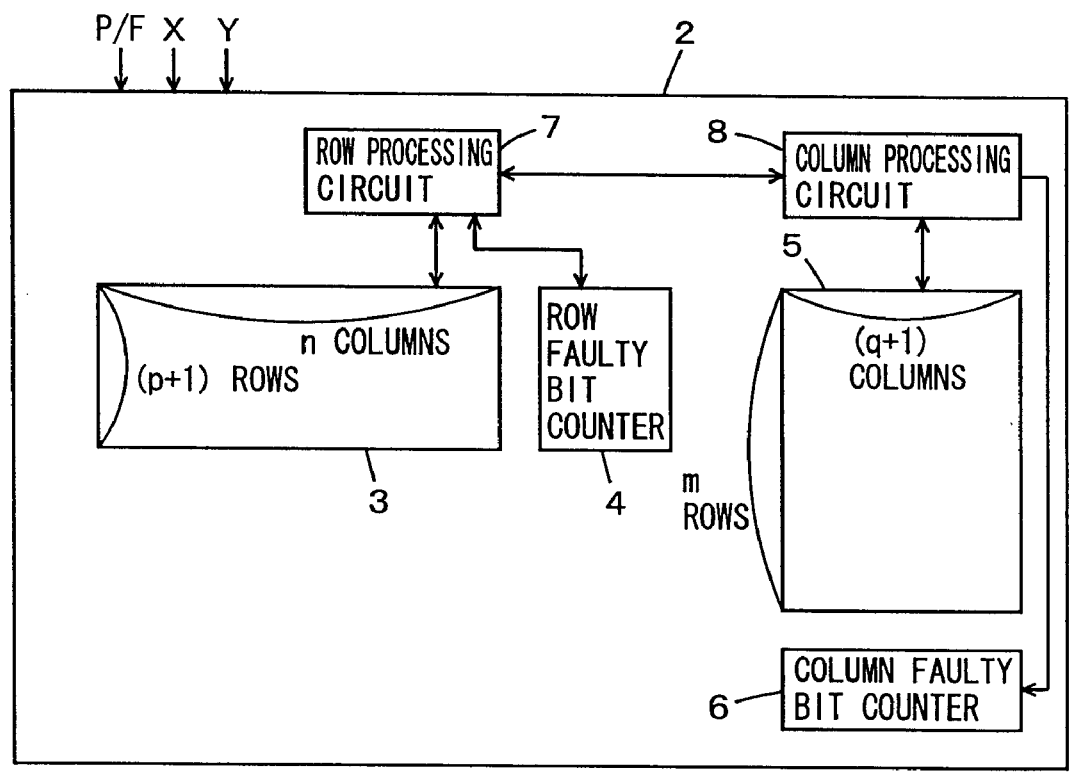
FIG. 2 schematically shows a structure of a repairability determining device according to a first embodiment of the invention.

FIG. 2 schematically shows a structure of a repairability determining device included in a tester according to the first embodiment of the invention. In FIG. 2, a repairability determining device 2 has a row-side faulty bit storage memory 3 which has memory elements arranged in (p+1) rows and n columns and stores faulty bit information on a row basis, a row faulty bit counter 4 which counts the number of faulty bits in each row of row-side faulty bit storage memory 3, a column-side faulty bit storage memory 5 which has memory elements arranged in m rows and (q+1) columns and stores faulty bit information on a column basis, a column faulty bit counter 6 which count the number of faulty bits in each column of column-side faulty bit storage memory 5, a row processing circuit 7 which controls the operations of row-side faulty bit storage memory 3 and row faulty bit counter 4 and also determines repairability of a faulty row, a column continuous processing circuit 8 which controls the operations of column-side faulty bit storage memory 5 and column faulty bit counter 6 and also determines whether a faulty column can be repaired.

Row and column processing circuits 7 and 8 determines the faults of a row and column independently of each other. When determination is made of the replacement with a spare circuit, row and column processing circuits 7 and 8 each send the replacement information relating to the repaired faulty bits to another.

As shown in FIG. 2, row-side and column-side faulty bit storage 25 memories 3 and 5 included in repairability determining device 2 have storage capacities substantially equal to those of spare row circuit 1r and spare column circuit 1c, respectively. Accordingly, the total storage capacity of row-side and column-side faulty bit storage memories 3 and 5 is significantly smaller than the storage capacity of semiconductor memory under test 1. Thus, the storage capacity of the faulty bit storage memories in repairability determining device 2 is significantly reduced. Each of row and column processing circuits 7 and 8 is formed of, e.g., a CPU (Central Processing Unit), and determines the repairability of a faulty bit and detect a faulty address in accordance with an operation algorithm which in turn will be specifically described below.

Figure 3:
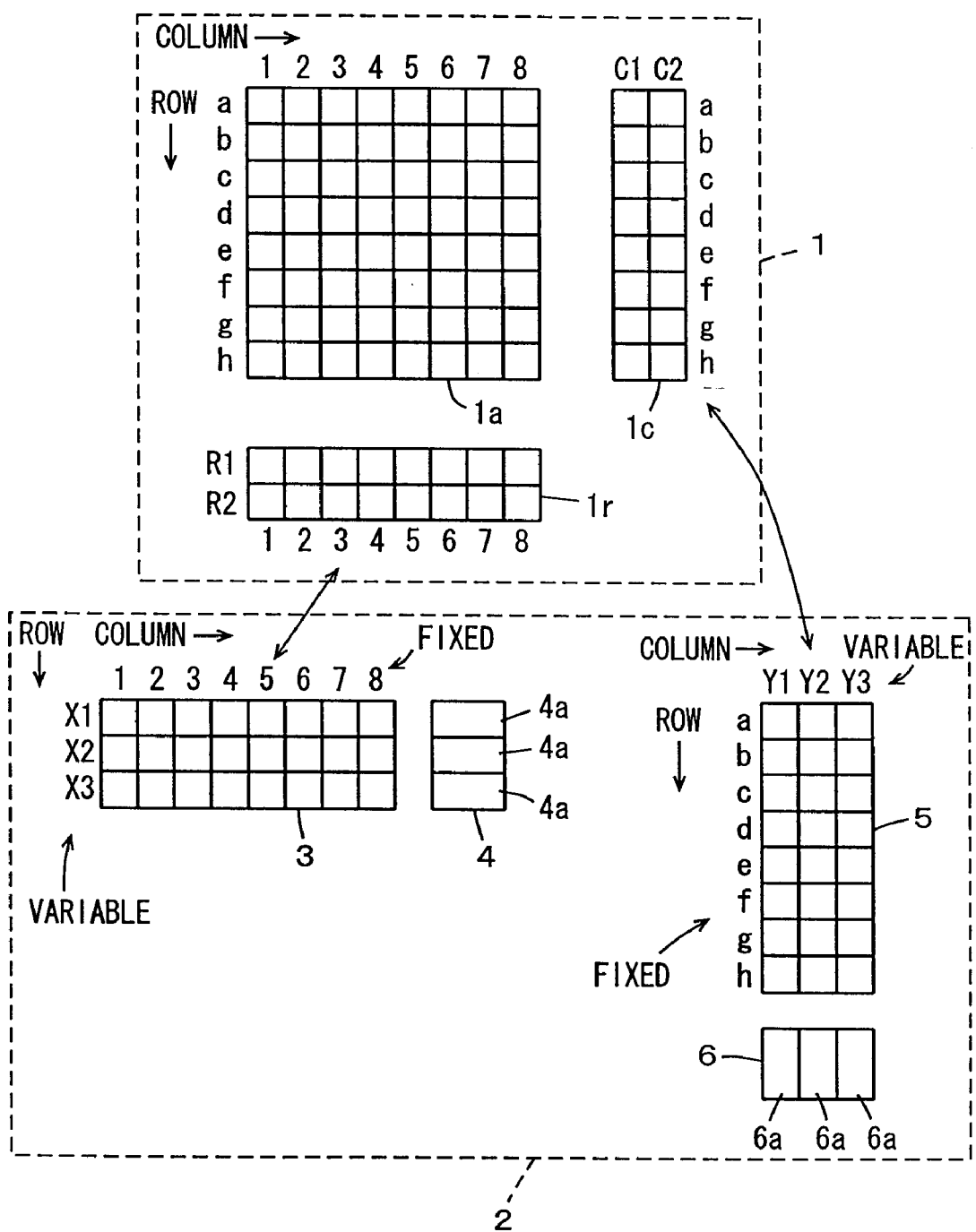
FIG. 3 shows specific examples of the semiconductor memory under test and the repairability determining device shown in FIGS. 1 and 2.

FIG. 3 shows specific examples of the semiconductor memory under test and the faulty bit storage memory. In FIG. 3, memory cell array 1a has memory cells arranged in 8 rows and 8 columns. In memory cell array 1a, the memory cells are designated by row addresses a–h and column addresses 1–8.

Spare row circuit 1r has spare memory cells arranged in 2 rows and 8 columns. In spare row circuit 1r, faulty row addresses R1 and R2 are programmed in accordance with the result of repairability determination.

Spare column circuit 1c has spare memory cells arranged in 8 rows and 2 columns. In spare column circuit 1c, faulty column addresses C1 and C2 are programmed in accordance with the result of repairability determination.

In repairability determining device 2, row-side faulty bit storage memory 3 includes memory elements arranged in 3 rows and 8 columns. Row addresses X1–X3 of row-side faulty bit storage memory 3 can be set and changed under control of row processing circuit 7 shown in FIG. 2. Row faulty bit counter 4 includes count circuits 4a provided corresponding to row addresses X1–X3 in row-side faulty bit storage memory 3, respectively.

Column-side faulty bit storage memory 5 includes memory elements arranged in 8 rows and 3 columns. Column addresses Y1–Y3 of column-side faulty bit storage memory 5 can be set and changed under control of column processing circuit 8 shown in FIG. 2. Column faulty bit counter 6 includes count circuits 6a provided corresponding to column addresses Y1–Y3, respectively. The counts of counters 4 and 6 can be reset under control of processing circuits 7 and 8, respectively.

Faulty bit storage memories 3 and 5 are merely required to be addressable memory circuits allowing data write/read.

Figure 4:
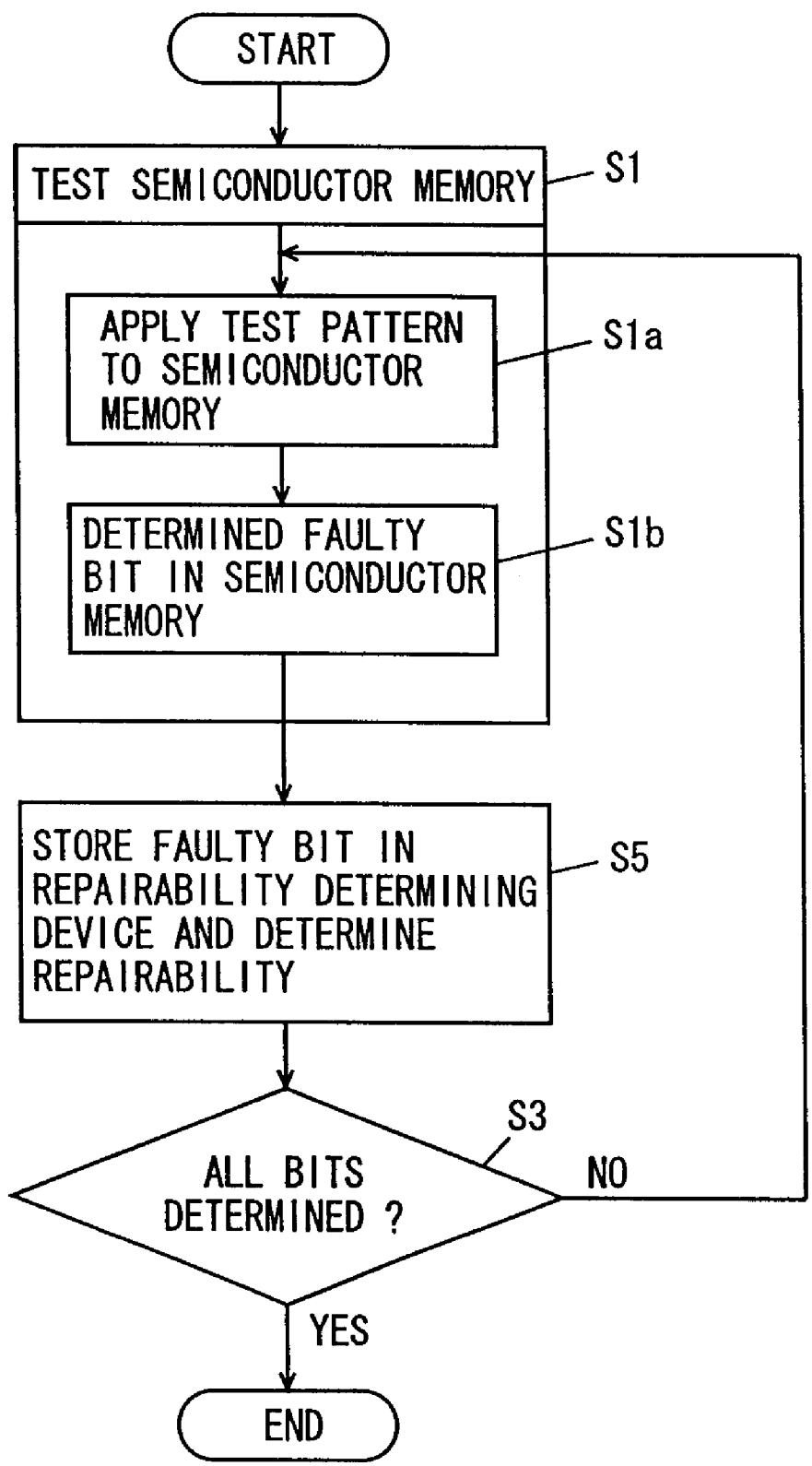
FIG. 4 is a flow chart representing an operation of a faulty bit repairability determining device according to the first embodiment.
Figure 21:
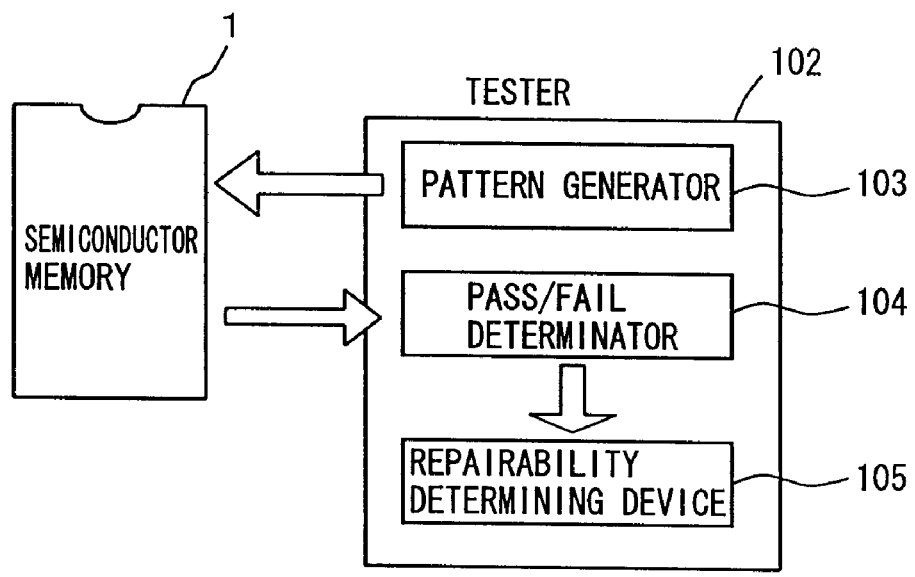
FIG. 21 schematically shows a structure of a conventional semiconductor testing apparatus.
Figure 22:
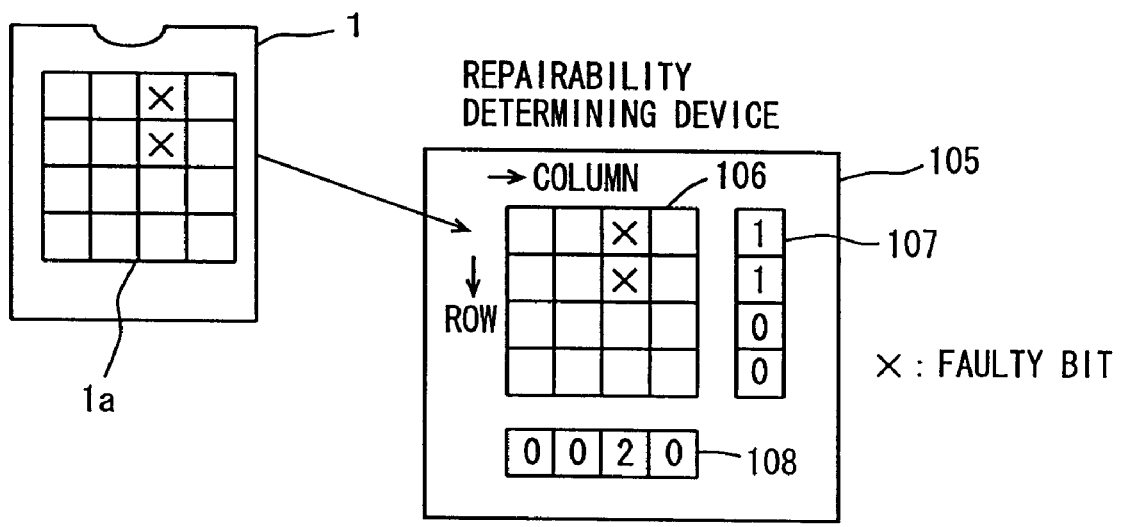
FIG. 22 schematically shows a structure of a repairability determining device in the prior art.
Figure 23:
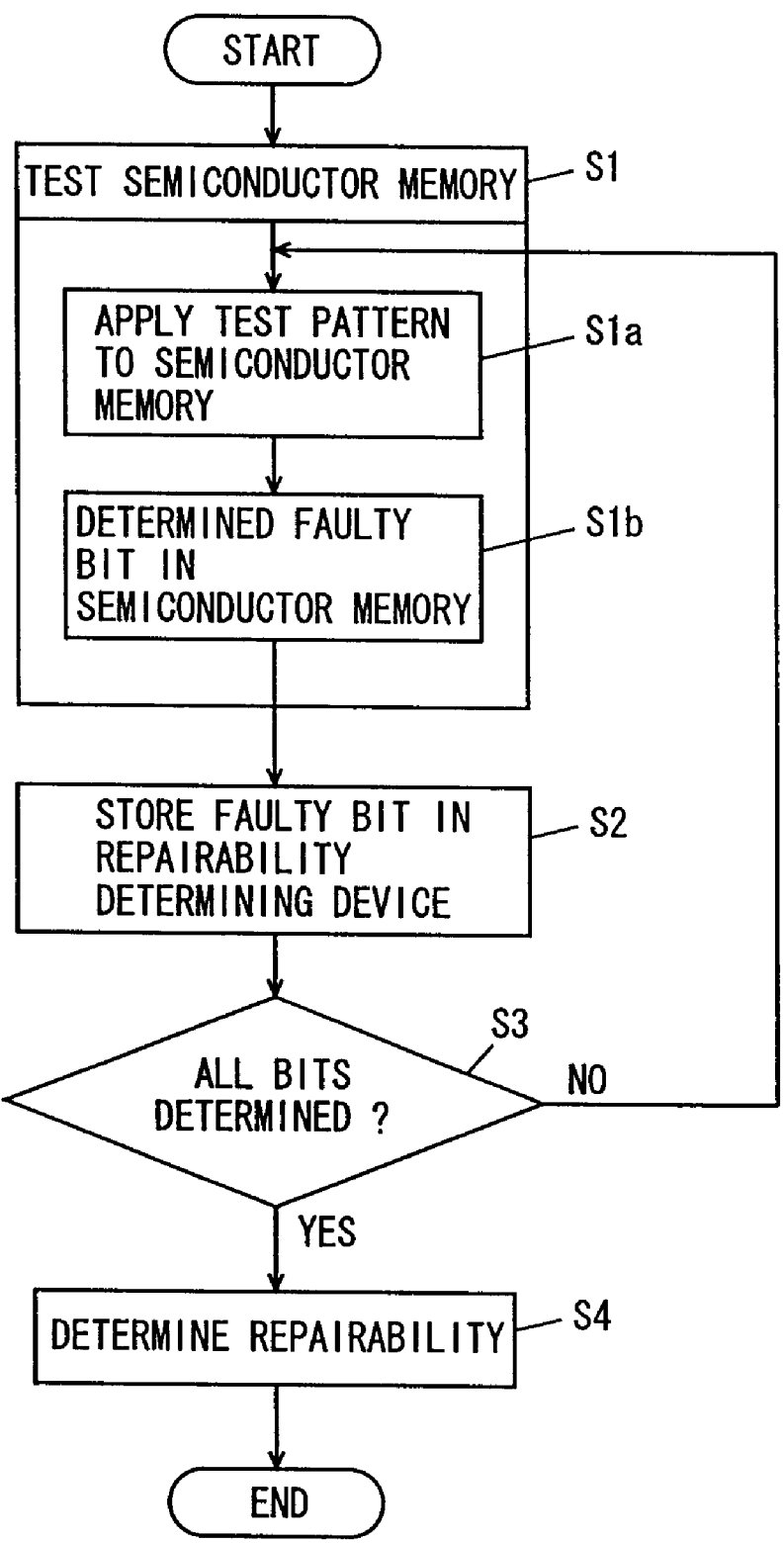
FIG. 23 is a flow chart representing a test operation of a semiconductor memory under test in the prior art.

The tester has a structure similar to that of the conventional tester shown in FIG. 21, and includes pattern generator 103 and pass/fail determinator 104 generating a pass/fail determination result to repairability determining device 2 shown in FIG. 2. Now, operation of the tester including the repairability determining device shown in FIGS. 2 and 3 will be schematically described below with reference to a flow diagram of FIG. 4.

After completion of the wafer process, semiconductor memory under test 1 is tested (step S1). In this test of the memory, a test pattern is applied to semiconductor memory under test 1 from the pattern generator in step S1a, and information is read out from semiconductor memory under test 1 and is compared with an expected value to determine a faulty bit in step S1b. The operations in steps S1a and S1b are the same as the conventional ones.

In the first embodiment, the faulty bit is stored in the repairability determining device according to the result of pass/fail determination, and the determination of repairability is performed concurrently with the storing operation (step S5). The faulty bit information is stored in faulty bit storage memories 3 and 5. At this time, processing circuits 7 and 8 individually determine whether the faulty bit information is to be stored in faulty bit storage memories 3 and 5 or not. The faulty bit, of which storage is determined to be unnecessary, is not written into the faulty bit storage memory.

Then, the determination on repairability is executed based on the faulty bit information stored in faulty bit storage memories 3 and 5. In the repairability determining operation, the determination of whether the repair can be performed or not as well as detection of the repaired faulty address are executed based on the count of each of count circuits 4a and 6a of row and column faulty bit counters 4 and 6. These determination and detection are executed in accordance with the algorithm which in turn will be described later in greater detail. The above operations are repeated until the test of all the bits of semiconductor memory under test 1 is completed (step S3). In step S3, if the test of every bit is not completed, the test pattern is applied to semiconductor memory under test 1 again. This process flow is made based on the assumption that a test pattern is applied to semiconductor memory device under test 1 and then data is read therefrom on a memory bank or a memory block basis. Thereby, it is possible to reduce a time required for writing the test pattern data into all the bits in an irrepairable semiconductor memory. More specifically, the application of the test pattern is stopped at the time when it is determined that the repair is impossible, whereby the test time can be reduced.

According to this first embodiment, the determination of repairability is not performed after completion of the pass/fail determination of all the bits, but is performed in parallel with storing of a faulty bit in the repairability determining device. Accordingly, when the test of all the bits is completed, the determination of repairability of the semiconductor memory under test is also completed. Thereby, the test time can be significantly reduced. The repairability determining operation will now be described with reference to the specific structure shown in FIG. 3.

Figure 5:
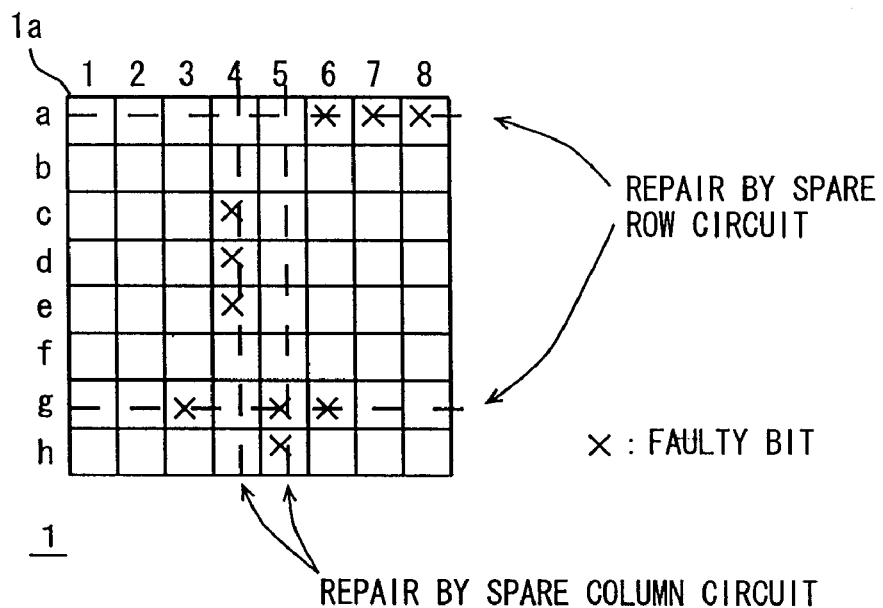
FIG. 5 schematically shows a distribution of faulty bits in the semiconductor memory under test as well as repaired bits.

It is now assumed that faulty bits are present in memory cell array 1a of semiconductor memory under test 1 as shown in FIG. 5. More specifically, it is assumed that faulty bits in the a-th row are present at 6th to 8th columns, a faulty bit in each of the c-th to e-th rows is present at the 4th column, faulty bits in the g-th row are present at the 3rd, 5th and 6th columns, and faulty bit in the h-th row is present at the 5th column. The spare row circuit can repair two faulty rows. Spare column circuit 1c can repair two faulty columns. Now, description will now be given on the case where the a-th and g-th rows are repaired by the spare row circuit, and the 4th and 5th columns are repaired by the spare column circuit. In the replacing operation described below, a row is preferentially replaced.

First, the test is performed on the a-th row. First, in row-side faulty bit storage memory 3, the address a is set as the X address because the faulty bit is present. In the a-th row of memory cell array 1a of semiconductor memory under test 1, the faulty bits are present at the 6th to 8th columns. In accordance with the result of pass/fail determination, therefore, information representing the faulty bits is stored at column addresses 6 to 8 in the row-side faulty bit storage memory. At this time, the count of count circuit 4a in row faulty bit counter 4 is set to 3 representing the number of the faulty bits.

At the same time, Y addresses 6, 7 and 8 representing the faulty bit positions in the a-th row are set at the 1st to 3rd columns in column-side faulty bit storage memory 5. Each count circuit 6a in column faulty bit counter 6 counts the number of faulty bits in the corresponding column, and has the count of 1. In row-side faulty bit storage memory 3, three faulty bits are present, which are larger in number than the spare column circuit. Therefore, it is decided the a-th row is repaired by replacement with the spare row circuit in accordance with the count of 3 of count circuit 4a. When this repair is decided, the faulty address a is fixedly set in the 1st row of row-side faulty bit storage memory 3. Thus, it is decided that a corresponding row is replaced with the spare circuit when the count of count circuit 4a of row faulty bit counter 4 exceeds the number of spare columns in the spare column circuit.

Information relating to decision of repairing the a-th row by the spare row circuit is transmitted to the processing circuit on the column side. In this state, the faulty bit information and faulty column address information 6–8 of faulty bit storage memory 5 are all reset, and the counts of faulty bit counters 6a are also reset. This is because the faulty bits in the a-th row are replaced with the spare row, and are not necessary to be repaired with the spare column circuit.

When the determination of repairability of the a-th row is completed, the test is then performed on the b-th row. As shown in FIG. 5, the faulty bit is not present at the b-th row in memory cell array 1a. Accordingly, particular operation for the b-th row is not performed in this repairability determining device.

Figure 7:
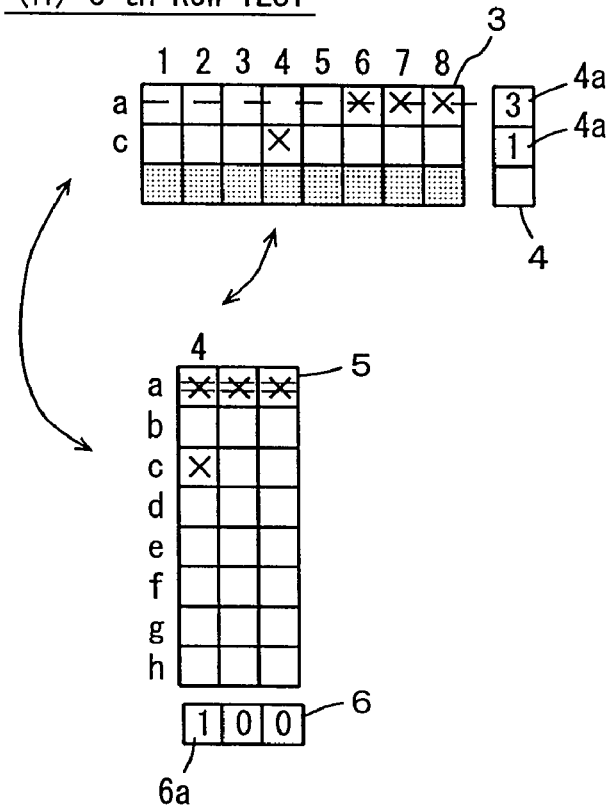
FIG. 7 shows by way of example an internal state of the repairability determining device in the first embodiment of the invention.

As shown in FIG. 7, the test is then performed on the c-th row. First, the address c is set as the row address (X) in the 2nd row of the row-side faulty bit storage memory 3. Then, faulty bit information is written into the 4th column (address 4) in accordance with the result of pass/fail determination. At the same time, the count of count circuit 4a corresponding to the 2nd row is set to 1 in row faulty bit counter 4. The contents of the first row including count circuit 4a are fixed.

In column-side faulty bit storage memory 5, the column address 4 containing the faulty bit in the row address c is set as the Y-address in the first column. By the setting of the faulty bit, the count of count circuit 6a in the first column is set to 1 in column faulty bit counter 6. The test of the c-th row in the memory cell array is completed.

Then, the test is performed on the d-th row in memory array 1a shown in FIG. 5. At this time, the row address d is assigned to the third row in row-side faulty bit storage memory 3. At the 4th column in the 3rd row of row-side faulty bit storage memory 3, the information indicating a faulty bit is stored in accordance with the faulty bit in memory cell array 1a, and the count of count circuit 4a corresponding to the 3rd row of row-side faulty bit counter 4 is set to 1. In row-side faulty bit storage memory 3, two faulty bits are present in the 4th column. For repairing these faulty bits by the spare row circuit, three rows of spare circuit are required. However, the spare row circuit can repair only two rows. Therefore, these faulty bits on the 4th column cannot be replaced with the spare row circuit, so that it is determined that the repair is to be performed by the spare column circuit. The information that the repair by the spare row circuit is impossible is transferred to the column-side processing circuit.

In column-side faulty bit storage memory 5, both row addresses c and d each have a faulty bit at the fourth column. Therefore, a faulty bit is newly stored at the row address d in the column address 4, and the count of corresponding count circuit 6a is set to 2.

At this time, row-side processing circuit 7 transmits the information indicating that the spare row circuit cannot repair the column address 4. Responsively, column-side processing circuit 8 decides that the column address 4 at the first column in column-side faulty bit storage memory 5 is to be replaced with the spare column, and this first column is fixed to the column address 4. By this decision of repair of the column address 4 by the spare column circuit, the addresses c and d in the 2nd and 3rd rows are reset in row-side faulty bit storage memory 3, and the count of corresponding count circuits 4a are also reset.

When the test of the d-th row is completed, the test of the e-th row is then performed.

Figure 9:
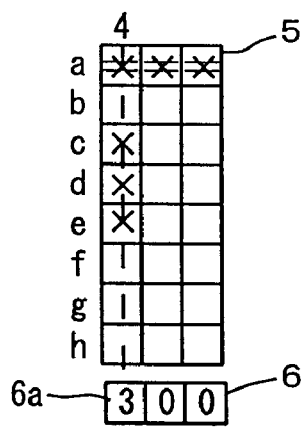

In the e-th row, as shown in FIG. 5, the faulty bit is present at the fourth column. By the preceding test of the d-th row, it is already decided that the 4th column is to be repaired by the spare column circuit. Based on this information, as shown in FIG. 9, row-side faulty bit storage memory 3 does not take in the faulty bit information of the 4th column in the e-th row because it is already decided that the 4th column is to be repaired by the spare column circuit. However, column-side faulty bit storage memory 5 stores the faulty bit information of the 4th column in the e-th row, and the count of corresponding count circuit 6a is incremented by one to 3.

Since the faulty bit is not present in the f-th row, the test is then performed on the g-th row. In the g-th row, as shown in FIG. 5, the faulty bits are present at the 3rd, 5th and 6th columns. In row-side faulty bit storage memory 3, as shown in FIG. 10, the 2nd row address is first set to the row address g, and the faulty bit information is stored on the 3rd, 5th and 6th columns. The count of corresponding count circuit 4a of counter 4 goes to 3. Since the count of count circuit 4a for the 2nd row is 3, row-side processing circuit 7 decides that the g-th row is to be repaired by the spare row circuit, and the information of this decision is transmitted to column-side processing circuit 8. Also, the address of the 2nd row in the row-side faulty bit storage memory 3 is fixed to g. The contents of the 2nd row having the address fixed are fixedly held.

In the column-side faulty bit storage memory 5, the column addresses 3 and 5 are set in the 2nd and 3rd columns in accordance with the faulty bit information, respectively, and the faulty bit information is stored on the g-th row. Also, the count of count circuit 6a is set to 1. However, column-side faulty bit storage memory 5 is controlled by the column-side processing circuit such that the information at the 2nd and 3rd columns in the g-th row thereof is cleared, and the column addresses 3 and 5 assigned to the 2nd and 3rd columns are reset because row-side processing circuit 7 has decided that the g-th row is repaired by replacement with the spare row circuit. As a result of this clearing, the count of count circuit 6a is decremented by one and is set to the initial value of 0. In this operation, the column-side faulty bit storage memory 5 does not store the information relating to the column address 6, but the information relating to the g-th row is cleared in accordance with the information on decision of repair applied from the row-side processing circuit, so that no problem arises.

When the test of g-th row is completed, the addresses of two rows in row-side faulty bit storage memory 3 are already fixed to the row addresses a and g, respectively, and the faulty row using the spare circuit is decided so that further repair of a faulty row is impossible. In the following operation, therefore, the faulty row flag is set to "1", and the faulty bit information is not stored in the row-side faulty bit storage memory.

Then, as shown in FIG. 11, the test is performed on the h-th row in memory array 1a. In the h-th row, the faulty bit is present at the fifth column. As described above, the faulty addresses of the two rows are already fixed in the row-side faulty bit storage memory, and the take-in of further faulty bit is inhibited. This is because the spare row circuit cannot be used.

In column-side faulty bit storage memory 5, the faulty column address 5 is newly assigned to the second column which is already cleared, and the information representing the faulty bit is stored in the h-th row. Also, the count of corresponding count circuit 6a is set to 1. Thus, the test of all the bits of memory cell array 1a is completed.

As shown in FIG. 12, when the test operation is completed, row-side faulty bit storage memory 3 has the faulty row addresses a and g fixed in the first and second rows. Column-side faulty bit storage memory 5 has the faulty address 4 fixed in the first column, and the faulty column address 5 assigned to the 2nd column. In this state, the count of count circuit 6a corresponding to the third column is 0, and the faulty column to be repaired is only the 5th column. Therefore, it is determined in accordance with the count of 1 count circuit 6 that the faulty column address 5 is to be repaired by the spare column circuit. Thereby, the faulty column address 5 is fixed in the 2nd column of column-side faulty bit storage memory 5.

In this state, if the faulty bits are present at two columns in the h-th row, these two faulty bits cannot be repaired by the spare column circuit. In this case, the column processing circuit generates information representing that the repair is impossible. Thereby, it is determined that the corresponding semiconductor memory under test cannot be repaired. Accordingly, if detected faulty bits are larger in number than the faulty bits which can be repaired by the spare row circuit and the spare column circuit, it is determined at this time point that the semiconductor memory under test cannot be repaired, and the subsequent test steps are not executed. Thus, the test time is reduced.

[General Operation Flow]

Figure 13:
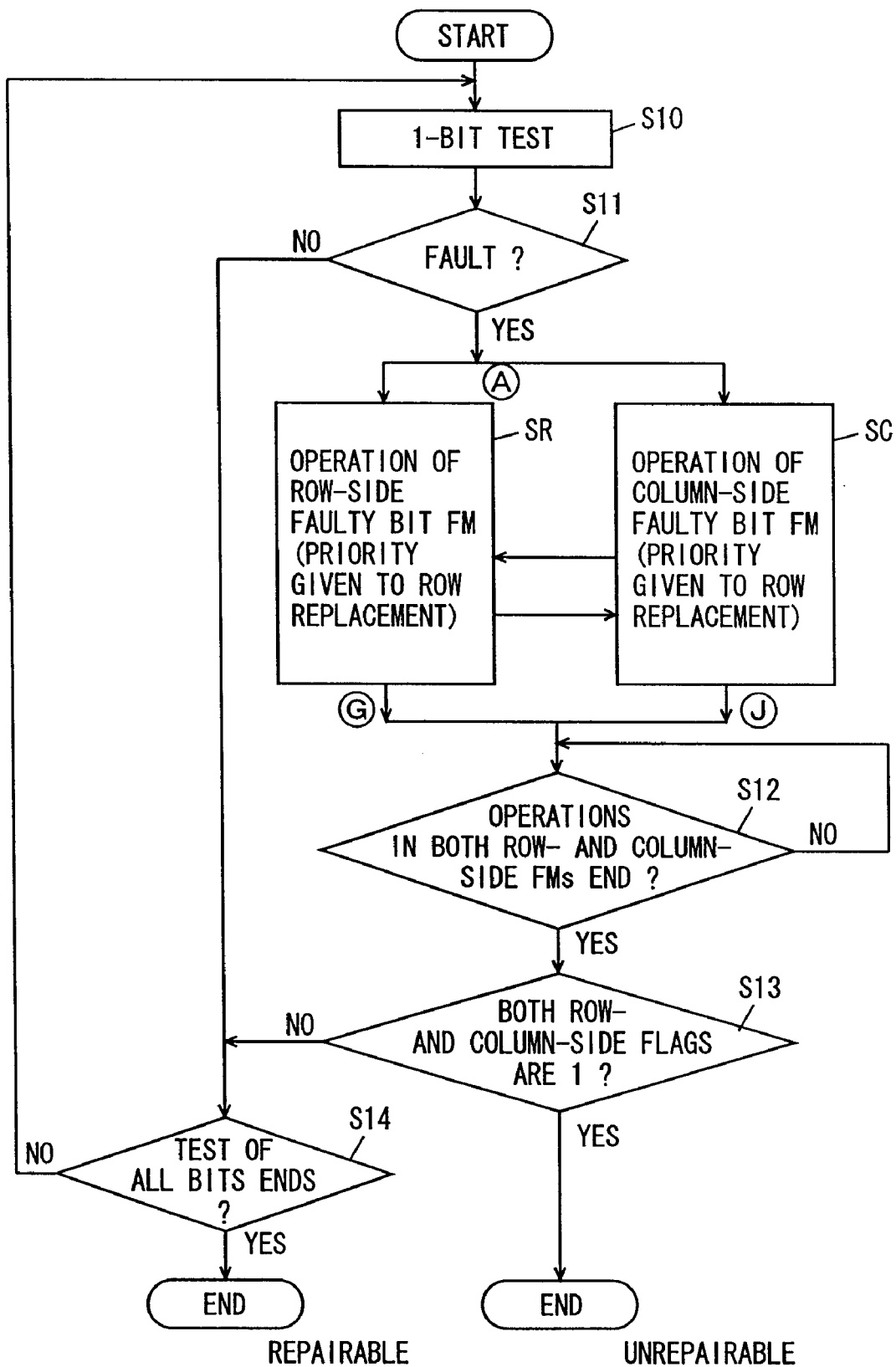
FIG. 13 is a flow chart representing operations of the repairability determining device according to the first embodiment of the invention.

FIG. 13 is a flow chart representing operations of determining the repairability according to the first embodiment of the invention. In FIG. 13, the test is executed a bit at a time in accordance with the pass/fail information received from the pass/fail determinator (determinator 104 shown in FIG. 21) (step S10). Based on the information received from the pass/fail determinator, it is determined whether the bit represented by the applied bit information is the faulty bit or not (step S11). If it is not the faulty bit, taking thereof into the faulty bit storage memory is not necessary, so that the process advances to a step S14, wherein it is determined whether the test (repairability determination) of every bit in the semiconductor memory under test is completed or not (step S14). This determination is made merely by using the counter, or by determining whether the bit at the final address is tested or not.

When the test of every bit is not completed, the process advances to step S10, and the information of the next bit (memory cell) is supplied from the pass/fail determinator.

In step S11, if it is determined that the faulty bit is present, a step SR of operating the faulty bit storage memory (referred to as "FM" hereinafter) on the row side is executed, and also a step SC of operating the faulty bit storage memory on the column side is executed. In the operation on these FMs, a higher priority is given to the row replacement. In these steps SR and SC, operations are performed to detect a faulty address, determine the repairability of the faulty address and fix the repairing faulty address.

When steps SR and SC for operating FMs are completed, the process advances to step S12, in which it is determined whether the processing of both the row- and column-side FMs is completed or not. Next processing is retarded until the end of processing of the row-and column-side FMs relating to the input faulty bit. When both steps SR and SC are completed, it is determined whether each of the row- and column-side flags is 1 or not (step S13). The row-side flag is a flag indicating that all the spare row circuits are used. The column-side flag is a flag indicating that all the spare column circuits are used. If both the row- and column-side flags are equal to 1, it is represented that all the spare rows and all the spare columns are used, and a further faulty bit cannot be repaired. In this case, therefore, the semiconductor device under test cannot be repaired so that the test of the test target semiconductor device ends.

If at least one of the row- and column-side flags is "0", there is a possibility that a faulty bit can be repaired. Therefore, the process advances to step S14, in which the next bit is tested. Accordingly, if at least one of the row- and column-side flags is "0" when the test of all the bits ends, the spare row circuits (spare rows) and the spare column circuits (spare columns) are all used at the maximum, and all the faulty bits in the semiconductor memory under test can be repaired, so that it is determined that these are repairable.

As shown in FIG. 13, therefore, the writing of faulty bit information into the faulty bit storage memory (FM) and the determination of repairability can be performed in parallel with each other. Therefore, the test time can be reduced.

Figure 14:
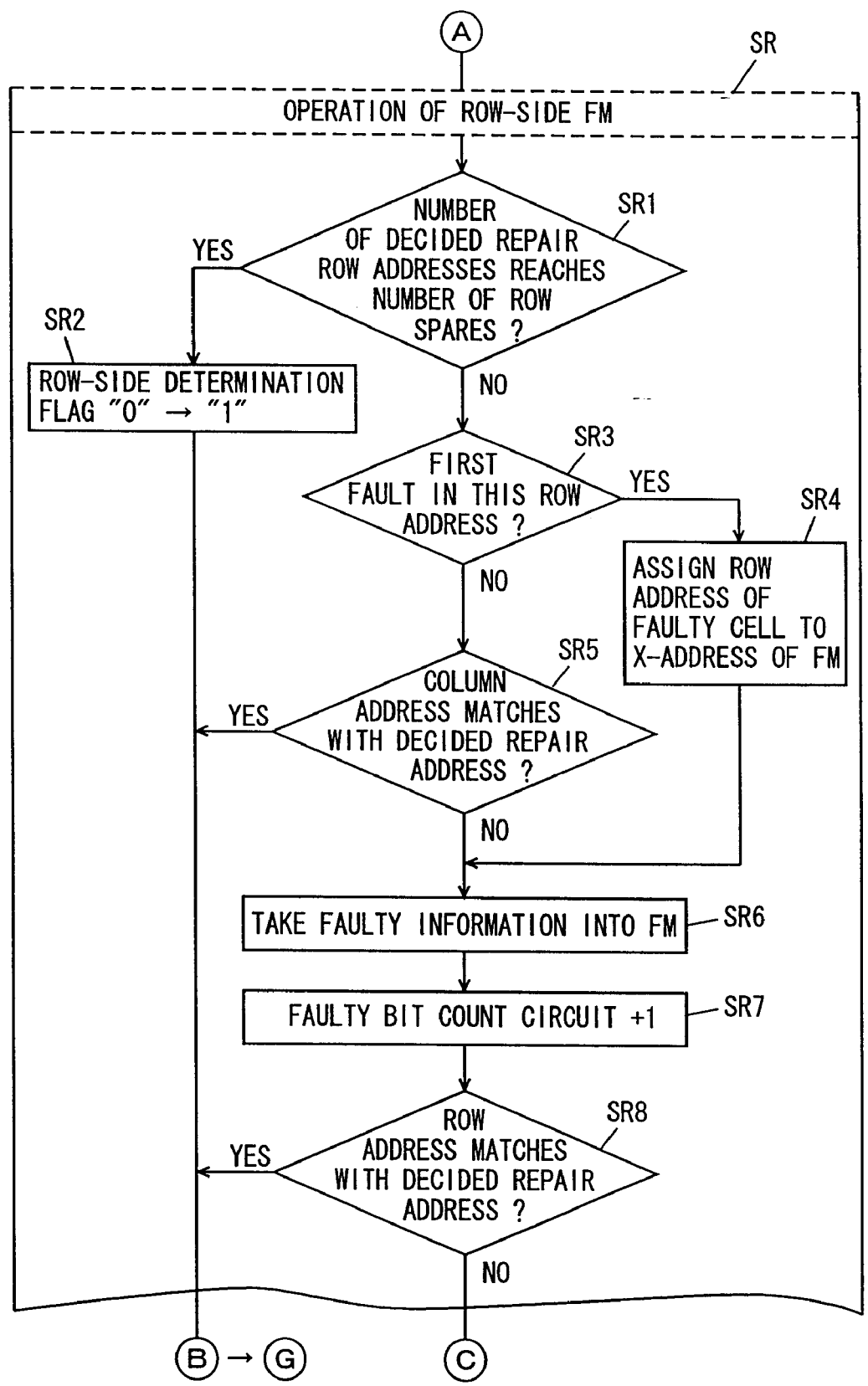
FIG. 14 shows an operation flow of a row-side faulty bit storage memory shown in FIG. 13.

FIG. 14 is a specific flow chart representing operation step SR of the row-side faulty bit storage memory (FM) shown in FIG. 13. FIG. 14 shows a flow of the operations performed by the row-side FM alone. When a faulty bit is found in step S11 shown in FIG. 13, in the row-side FM, determination is made on whether the number of the decided repair row addresses has reached the number of the row spares (spare row circuit) or not (step SR1). The decided repair row address represents the (faulty) row address fixed in the row-side FM. If the number of decided repair row addresses has reached the number of row spares, a further faulty row cannot be repaired so that the row-side determination flag of "0" is set to "1" (step SR2). When the row-side determination flag is set to "1", a faulty bit cannot be repaired by the spare row, so that the operation of the row-side FM is completed. The operation of raising the row-side determination flag to "1" corresponds to the operation, in which two spare row circuits shown in FIG. 10 are used and in the following test shown in FIG. 11, the faulty bit is not taken into the row-side FM.

In step SR1, if any one of row spares in the spare row circuit is not yet used, reference is made to the row address of the faulty bit, and it is determined whether the faulty bit is the first faulty bit at the current faulty row address or not (step SR3). The determination is made merely by referring to the faulty addresses assigned to the X-address of the row-side FM. If it is the first faulty bit at the row address, the row address of this faulty cell is assigned to the X-address of the row-side FM. This corresponds to the operation of assigning the address a in the processing shown in FIG. 6, for example.

When a faulty bit is already detected at the current faulty row address, reference is made to the column address of this faulty bit, and it is determined whether the column address matches with the decided repair column address or not (step SR5). If the faulty column address matches with the decided repair column address, this faulty bit is already repaired by the spare column circuit in operation SC of the column-side FM and is not taken into the row-side FM, and operation SR of the row-side FM is completed. After step SR4 or SR5 is executed, this faulty bit information is stored at the faulty row address (step SR6). Then, the count of the corresponding faulty bit count circuit by one (step SR7) in accordance with the taken faulty bit.

Then, it is determined whether this faulty row address matches with the decided repair row address (step SR8). If the row address matches with the decided repair row address, the distribution of the faulty bit on the faulty row is merely stored, and the operation of the row-side FM is completed. If the faulty row address does not match with the decided repair address, the processing is performed in conjunction with the operation RC of the column-side FM. Such an operation step may be employed that step SR8 is performed before step SR6 and further faulty bit information is not stored into the decided repair row address.

Figure 15:
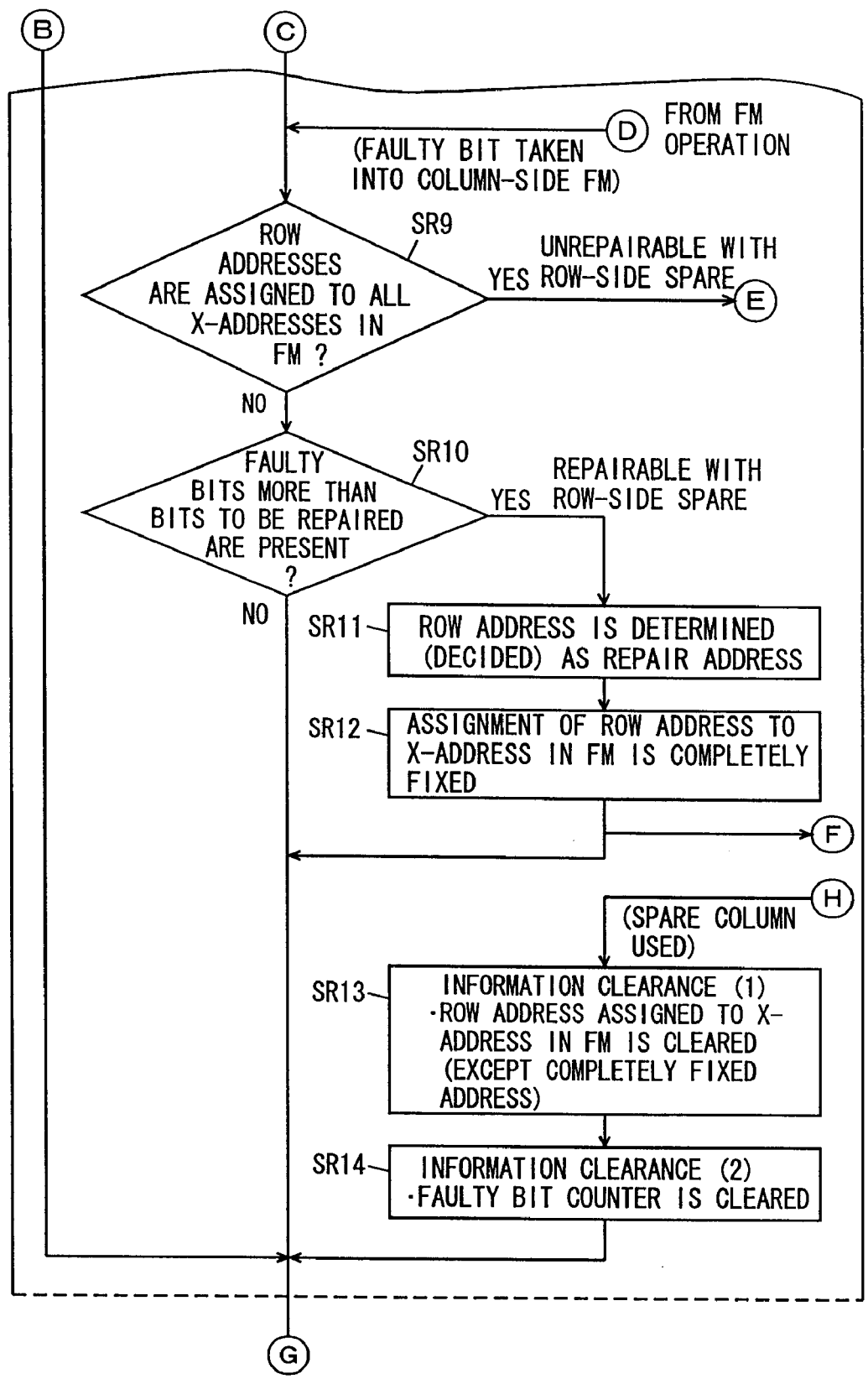
FIG. 15 shows an operation flow of the row-side faulty bit storage memory following the flow in FIG. 14.

FIG. 15 shows a flow of operations of the row-side FM which are performed in conjunction with the operations of the column-side FM. Referring to FIG. 15, description will now be given on the processing operations of the row-side FM performed in conjunction with the operations of the column-side FM.

In step SR8 shown in FIG. 14, if the row address does not match with the decided repair row address, the column-side FM operation informs take-in of the faulty bit into the column-side FM, and then it is determined in the row-side FM whether row addresses are assigned to all the X-addresses of the row-side FM or not. That the faulty bit is taken into the column-side FM represents that this faulty bit is not yet repaired by the spare column circuit. If row addresses are assigned to all the X-addresses of the row-side FM, this state corresponds to the state where the faulty rows are larger in number than the row spares in the spare row circuit. In this case, the repair by the row-side spare circuit is impossible, and the subsequent processing is transferred to the operations of the column-side FM. This operation corresponds to the operations shown in FIG. 8.

If row addresses are not assigned to all the X-addresses of the row-side FM, it is determined whether faulty bits larger in number than the spare column circuits are present at that faulty row address or not (step SR10). This corresponds to the following operation performed, e.g., in the case where three faulty bits are present in the a-th row shown in FIG. 6. In this case, the faulty bits are more than the spare columns in the spare column circuit, and these three faulty bits cannot be repaired by the spare column circuits, and it is determined that the repair is performed by the spare row circuit. In this case, therefore, the row address is determined (decided) as the repair address (step SR11), and that row address is assigned to the X-address of this row-side FM in a completely fixed manner (step SR12). This corresponds to the fixing of the row address a in the arrangement shown in FIG. 6.

Figure 8:
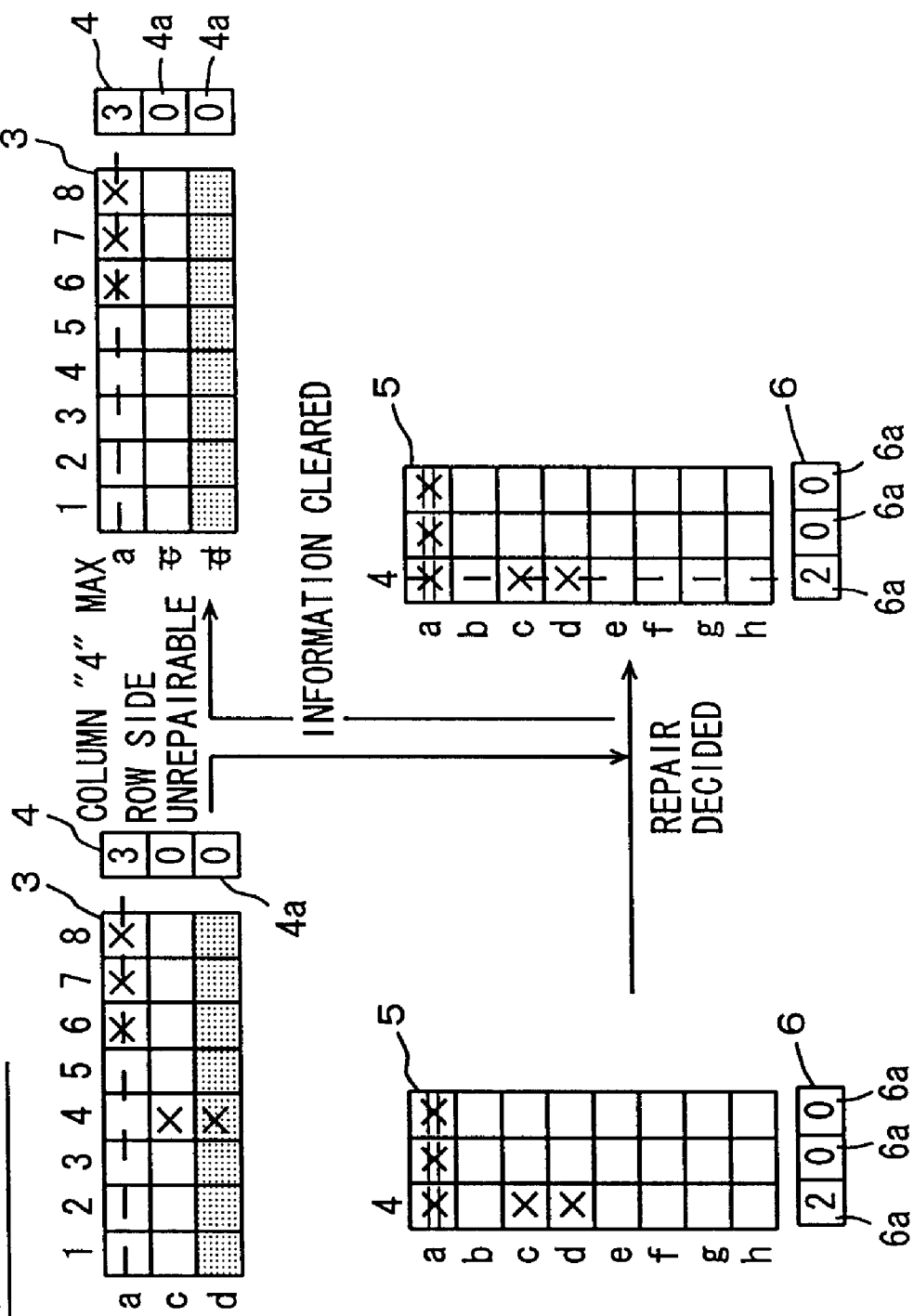

In step SR9, if all the X-address of the row-side FM are assigned row addresses, respectively, it is determined that the repair by the row-side spares is impossible. If all the X-addresses of the row-side FM are assigned row addresses, respectively, the faulty rows are larger in number than spare rows in the spare row circuit so that, as shown in FIG. 8, it is determined whether a repairable faulty bit is present in the same column or not, and the faulty bit is repaired in accordance with this determining operation.

In the above operation on the column side, if it is indicated that the faulty bit is repaired and the spare column circuit is used, information relating to the undecided row address assigned to the X-address of the row-side FM is cleared (step SR13). This operation corresponds to the operation in which when two faulty bits are present in the 4th column of the structure shown in FIG. 8, the faulty bit information on the addresses c and d in the row-side FM are cleared when the repair by the spare column circuit is decided. Then, the count of the corresponding faulty bit count circuit is cleared (step SR14).

Thereby, a series of operations of the row-side FM is completed, and the process moves to step S12 shown in FIG. 13 together with the column-side processing.

Figure 16:
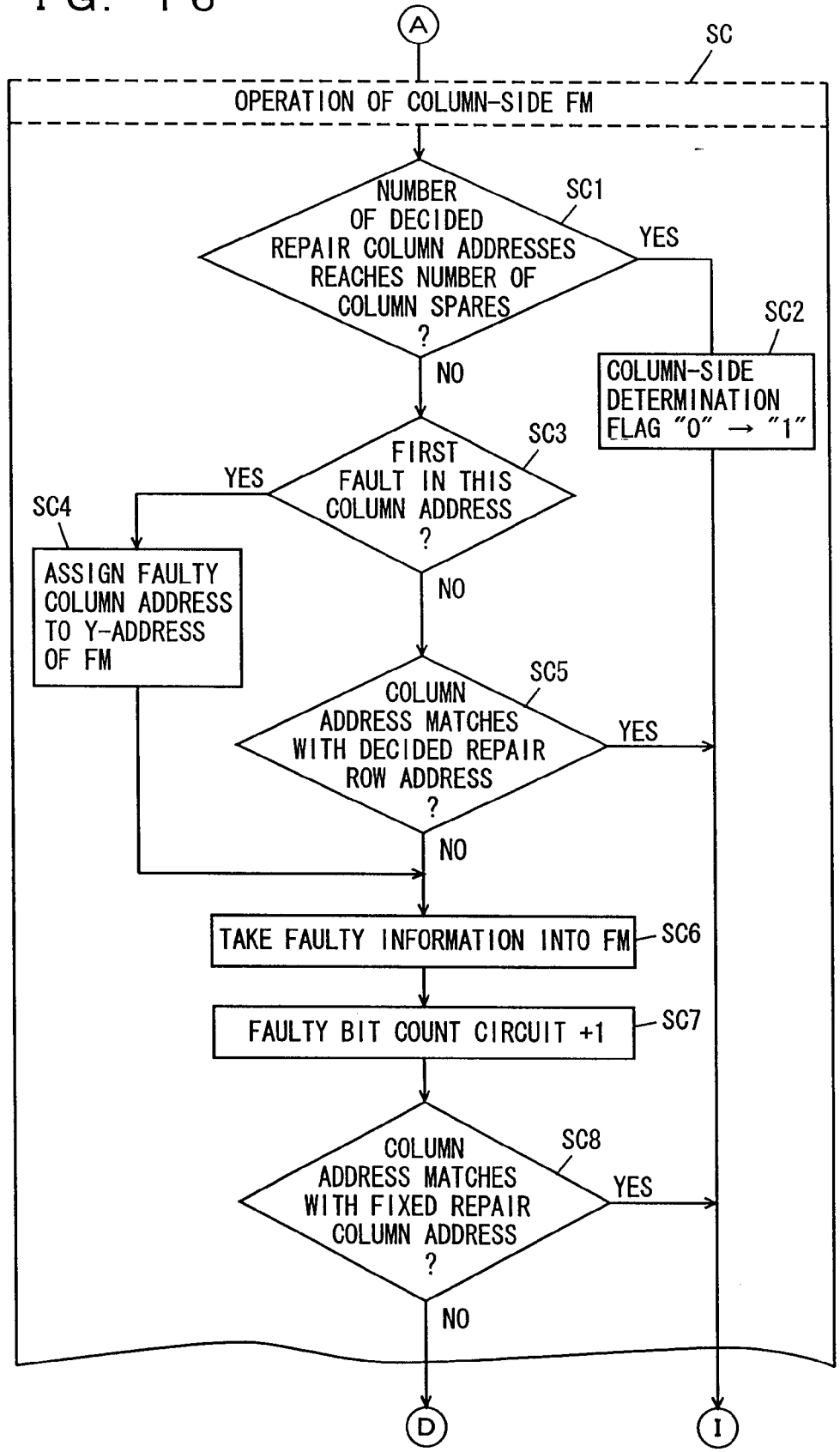
FIG. 16 shows an operation flow of a column-side faulty bit storage memory shown in FIG. 13.

FIG. 16 is a specific flow chart of operation step SC of the column-side FM. In particular, FIG. 16 shows a flow of the operations performed on the column side independently of those on the row side in operation step SC of the column-side FM. Referring to FIG. 16, operation step SC of the column-side FM will now be described.

Upon reception of the faulty bit information from the pass/fail determinator, it is first determined in the column-side FM whether the number of the decided repair column addresses has reached the number of the column spare circuit (column spares) or not (step SC1). If all the spare columns are already assigned to repair column addresses, a further faulty bit cannot be repaired by the spare column circuit so that this faulty bit is not taken in, and the column-side determination flag is set to "1" (step SC2). Accordingly, the operation on the column-side FM ends.

If every column spare circuit has not been used, it is first determined whether this faulty column address is the first faulty column address (i.e., the address which is first applied) or not (step SC3). If it is the first faulty column address, the faulty column address is assigned to Y-address of the column-side FM (step SC4). This operation to the operation of assigning the faulty column address 6 in FIG. 6.

Figure 6:
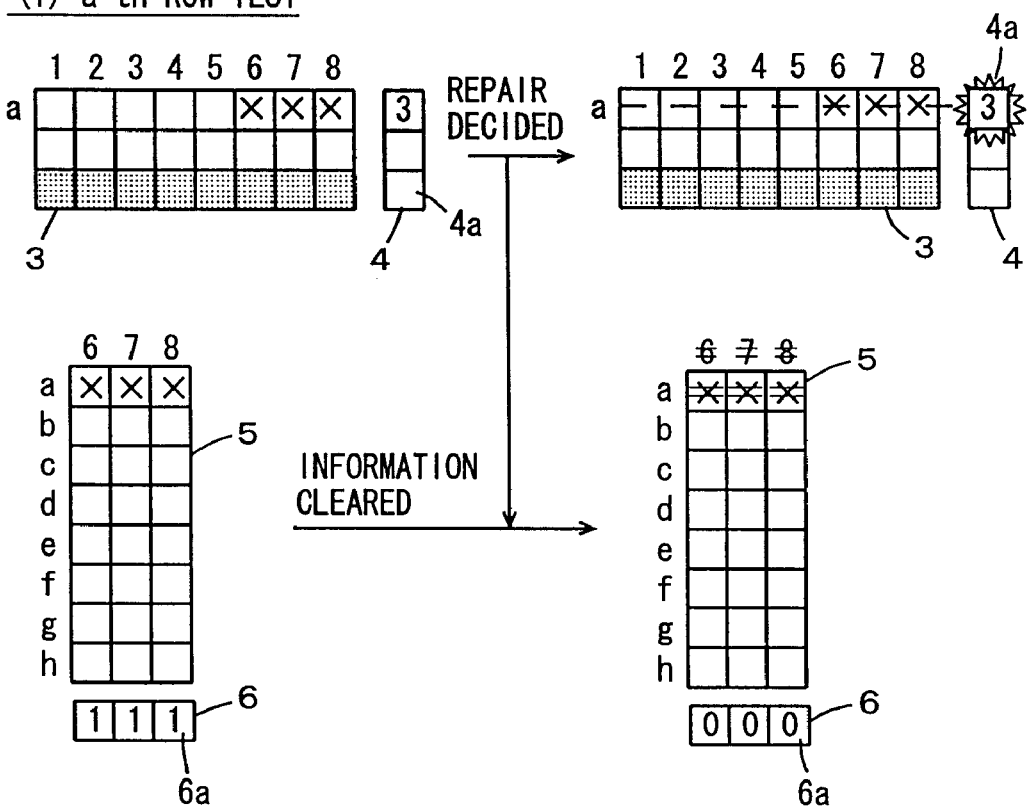
FIG. 6 schematically shows a state of the repairability determining device in the first embodiment of the invention.

If a faulty bit is already present at this faulty column address, it is determined whether the row address of this faulty bit matches with the decided repair row address or not (step SC5). If this faulty row address matches with the decided repair row address, this faulty bit is already repaired by the spare row circuit so that take-in of the faulty bit is not necessary, and the operation of the column-side FM ends. This corresponds to the state in which a further faulty bit on the a-th row will be no longer taken into the column-side FM, when the repair of the a-th row in FIG. 6 is decided.

After the processing steps SC4 or SC5 is executed, it is necessary to take in this faulty bit so that the faulty bit information is taken into the column-side FM (step SC6). Then, the count of the faulty bit count circuit corresponding to the column address of the faulty bit is incremented by one (step SC7).

Then, it is determined whether this column address matches with the decided repair column address or not (step SC8). Since the faulty bit at the fixed repair column address is already decided to be repaired, further operation is not required, and the operation of the column-side FM is completed. This corresponds to the state of the structure shown in FIG. 9, in which the faulty bit information is taken into the e-th row on the repair decided column address "4" in the column-side FM. Step SC8 may be performed before step SC6.

If this faulty column address is different from the decided repair column address, the processing is performed in conjunction with the operations of the row-side FM.

Figure 17:
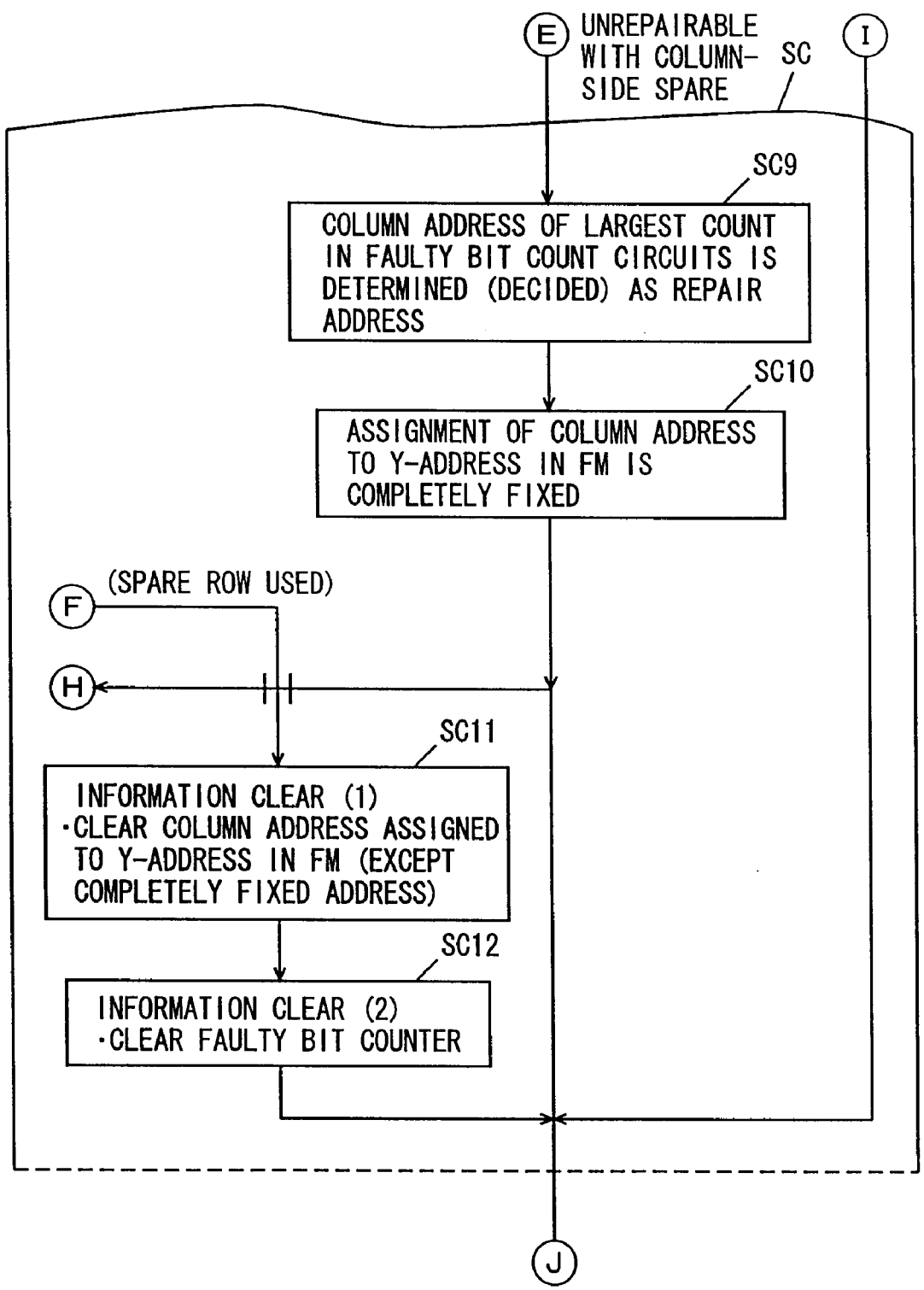
FIG. 17 shows an operation flow of the column-side faulty bit storage memory following the flow in FIG. 16.

FIG. 17 is a flow chart representing operations of the column-side FM which are performed in conjunction with the operations of the row-side FM In step SC8, if the column address does not match with the decided repair column address, the process advances to processing step SR9 of the row-side FM shown in FIG. 15. More specifically, the column address "4" is not yet decided as a repair column address in the structure shown in FIG. 8, for example. Accordingly, the foregoing operation of the row-side FM is performed. In the row-side FM, when row addresses are already assigned to all the X-addresses of the row-side FM, respectively, or when faulty rows more than the spare rows are present, information indicating that the repair of the faulty bit by the spare row circuit is impossible is supplied to the column-side FM (node E).

When the column-side FM receives this information indicating that the repair by the spare rows is impossible, it is determined (decided) that the repair address is the column address having the largest count among the faulty bit count circuits (step SC9). This corresponds to the operation of the structure shown in FIG. 8, in which the 4th column is decided as the repair address because the count circuit of the 4th column has the largest count in column-side FM 5.

When the repair column address is decided, assignment of this column address to the Y-address in the column-side FM is completely fixed (step SC10). This processing corresponds to the processing where the column address "4" is fixed to the 1st column in column-side FM 5 in FIG. 8.

After the repair column address is decided in this step SC10, the corresponding faulty row address and the relating information in the row-side FM are cleared via a node H in steps SR13 and SR14.

When the repair row address is decided in step SR12 shown in FIG. 15, the decision of the repair row address is informed via a node F. Responsively, the information on the repaired row is reset in the column-side FM. More specifically, the column addresses assigned to the Y-addresses of the column-side FM are first cleared except the completely fixed column addresses (step SC11). This operation corresponds to the operations shown in FIGS. 6 and 10. Then, the count of the corresponding faulty bit count circuit is reset. Thereby, a series of operations of the column-side FM is completed. Thereafter, the processing in step S12 common to the row and column sides shown in FIG. 13 is executed.

Figure 18:
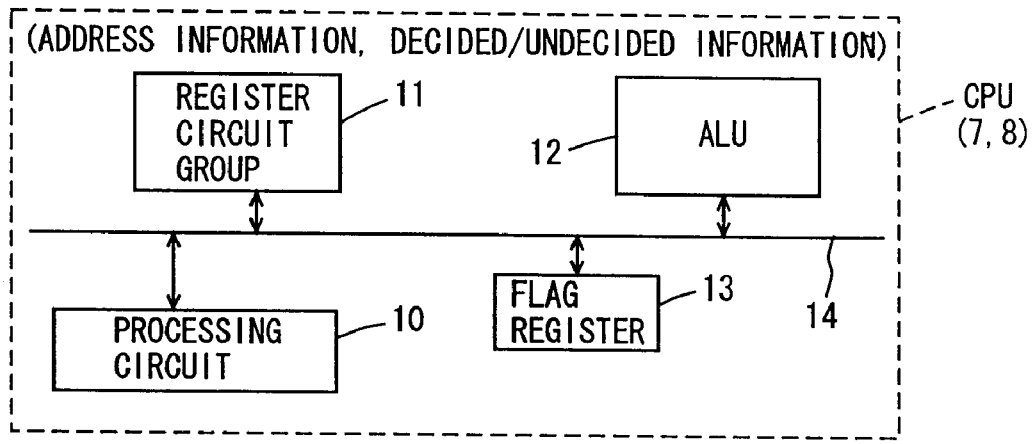
FIG. 18 schematically shows a structure of processing circuits shown in FIG. 2.

FIG. 18 schematically shows a structure of row and column processing circuits 7 and 8 shown in FIG. 2. Since these row and column processing circuits 7 and 8 have the same structures, FIG. 18 shows only one of them as a processing circuit CPU.

In FIG. 18, processing circuit CPU includes an operation control circuit 10 for performing necessary control in accordance with a predetermined algorithm, a register circuit group 11 for storing addresses assigned to the faulty bit storage memory, an arithmetic and logic unit (ALU) 12 for detecting the number of faulty bits and the maximum count or the like, and a flag register 13 for storing a flag indicating the repairability. These circuits are connected together via an internal bus 14.

The operation control circuit 10 executes predetermined processing in accordance with a program implementing the foregoing algorithm shown in FIGS. 14 to 17.

Register circuit group 11 stores, for example, the addresses assigned to the corresponding faulty bit storage memory together with the corresponding address flags. These address flags are set when the corresponding addresses are set into the decided state.

Flag register 13 is set to "1" when new faulty bit information is applied after all the corresponding redundant circuits are used. Arithmetic and logic unit 12 executes processing such as comparison of the counts. With reference to the address of register circuit group 11, access to a fixed address of the corresponding faulty bit storage memory is inhibited, and processing such as clearing of an undecided repair address is also performed.

As described above, according to the first embodiment of the invention, the faulty bit storage memories are provided for the row and the column in the semiconductor memory, respectively. Therefore, the test time can be reduced, and the storage capacity of the faulty bit storage memory can be reduced.

Both or one of row and column processing circuits 7 and 8 perform the four operations shown in FIG. 13 of monitoring the end of processing and determining whether both the flag values are "1" or not.

[Second Embodiment]

Figure 19:
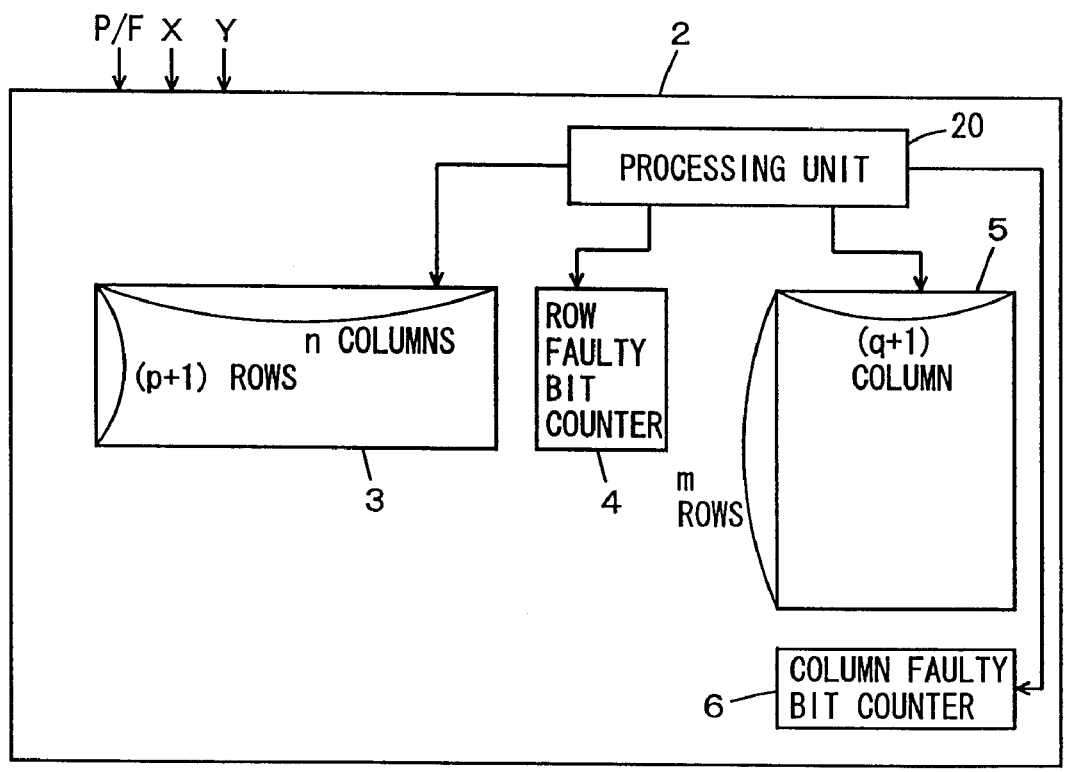
FIG. 19 schematically shows a structure of a repairability determining device according to a second embodiment of the invention.

FIG. 19 schematically shows a structure of a repairability determining device according to a second embodiment of the invention. In repairability determining device 2 shown in FIG. 19, a processing circuit 20 is provided commonly to the row- and column-side faulty bit storage memories. Processing circuit 20 also controls both row and column faulty bit counters 4 and 6.

By determining the faulty bit repairability of the rows and columns by a single processing circuit 20, the reference to a repair address can be made by referring to the register in processing circuit 20 so that the processing speed can be increased. Since only a single processing circuit 20 is required, the device scale can be small.

According to the second embodiment, as described above, a common processing circuit 20 is provided to the determination of the repairability of both a faulty row address and a faulty column address, and therefore, the device scale can be small.

[Third Embodiment]

Figure 20:
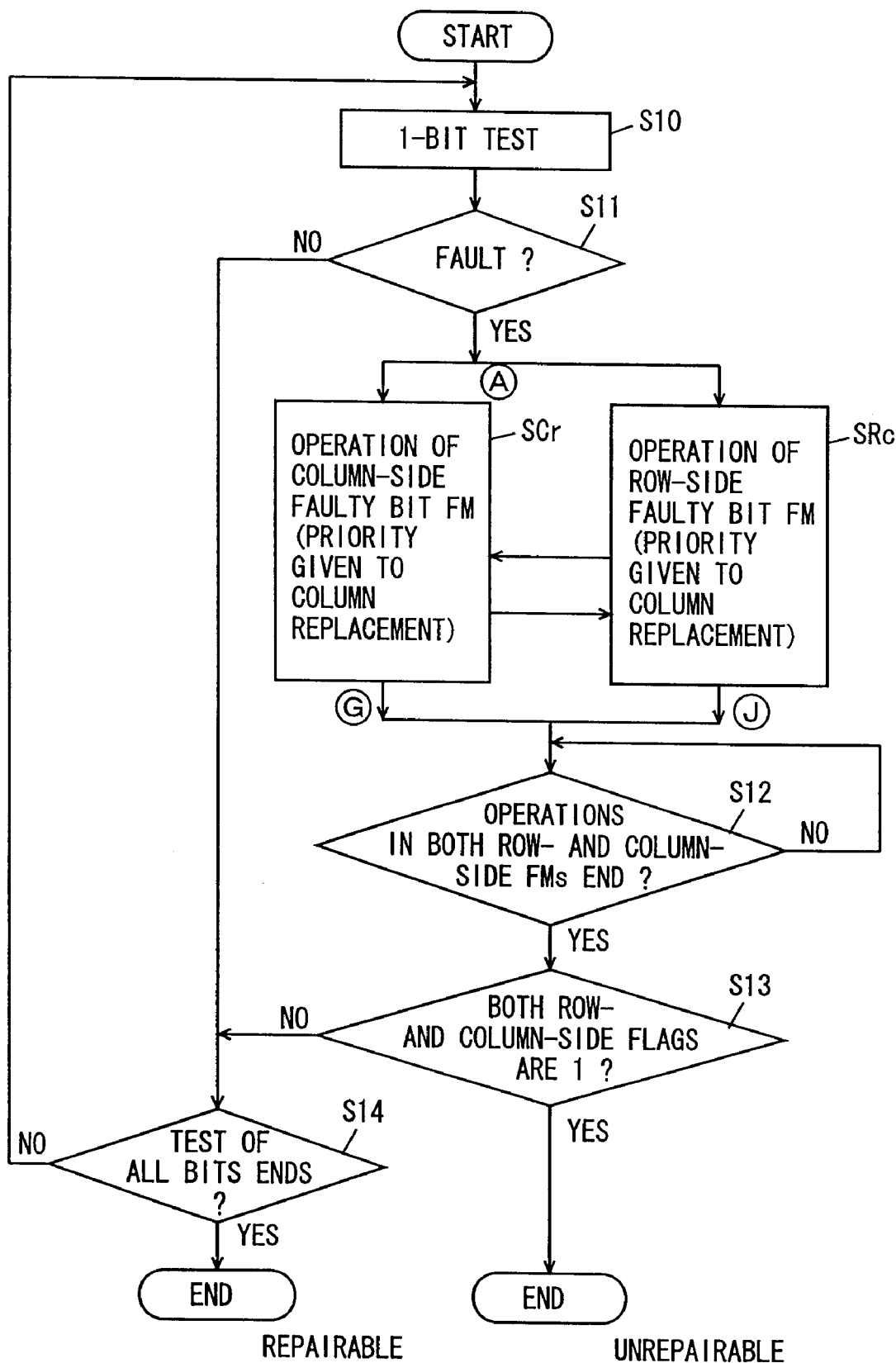
FIG. 20 is a flow chart representing operations of a repairability determining device according to a third embodiment of the invention.

FIG. 20 shows a flow of operations of determining the faulty bit repairability according to a third embodiment of the invention. In the flow of the repairability determining operations shown in FIG. 20, the priority is given to the column replacement upon determining the repairability after a faulty bit is found. More specifically, when it is determined in step S11 that a faulty bit occurs, a step SCr of operating the column-side faulty bit storage memory (FM) and a step SRc of operating the row-side faulty bit storage memory (FM) are executed. In these operations, a higher priority is given to the column replacement. Operation step SCr for the column-side faulty bit storage memory (FM) can be achieved by the foregoing step of operating the row-side faulty bit storage memory in the first embodiment except for that the columns are substituted for the rows, and Y is substituted for X. Likewise, operation step SRr for the row-side faulty bit storage memory can be achieved by the foregoing operation step SC of operating the column-side faulty bit storage memory in the first embodiment except for that the rows are substituted for the columns, and X is substituted for Y.

In the case where a higher priority is given to the column replacement, a spare column is used and the repair column address is decided, and then corresponding X-address in the row-side faulty bit storage memory is cleared. When it is determined that the repair by the spare column circuit is impossible, the row address of the largest count is decided as the repair address. In this case, the row and column faulty bit storage memories are likewise arranged independently of each other, so that effects similar to those of the first embodiment can be implemented.

[Other Examples of Application]

In the embodiments described above, the semiconductor memory has been described as an example of the semiconductor integrated circuit device under test. However, the invention can be applied to a memory-merged logic or a logic-mixed memory having a memory and a logic integrated on a common semiconductor chip, because faulty bits in such a memory are to be repaired.

The invention can be applied to various semiconductor integrated circuit devices, provided that the circuit includes a memory array having memory cell addressed by row and column addresses, and redundant circuits for repairing a faulty memory cell (bit).

According to the invention, as described above, since the faulty bit storage memories are provided corresponding to the spare row circuit and the spare column circuits, respectively, the time required for determining the repairability of the semiconductor memory under test can be reduced, and the storage capacity of the faulty bit storage memory can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor test device for testing a semiconductor memory device including (i) a plurality of memory cells each specified by a row address and a column address, and (ii) a redundant circuit for repairing a faulty cell among said plurality of memory cells, comprising:

a row faulty bit storage memory for storing a position of a faulty cell on a row address in association with a column address of the faulty cell; and a column faulty bit storage memory arranged separately from said row faulty bit storage memory for storing a position of a faulty cell on a column address in association with a row address of that faulty cell.

2. The semiconductor test device according to claim 1, wherein said redundant circuit has a spare row circuit for repairing a faulty row and a spare column circuit for repairing a faulty column, a storage capacity of said row faulty bit storage memory is no less than a storage capacity of said spare row circuit, a storage capacity of said column faulty bit storage memory is no less than a storage capacity of said spare column circuit, and a total storage capacity of the row and column faulty bit storage memories is smaller than a storage capacity of said plurality of memory cells.

3. The semiconductor test device according to claim 1, wherein said redundant circuit has a spare row circuit for repairing a faulty row and a spare column circuit for repairing a faulty column, said row faulty bit storage memory has columns equal in number to columns in said spare row circuit, and has rows smaller in number than rows of the memory cells, and said column faulty bit storage memory has rows equal in number to rows in said spare column circuit, and has columns smaller in number than columns of the memory cells.

4. The semiconductor test device according to claim 3, further comprising:

means for setting a row address of the faulty cell for a row of said row faulty bit storage memory when the faulty cell is detected; and means for setting a column address of the faulty cell for a column of said column faulty bit storage memory when the faulty cell is detected.

5. The semiconductor test device according to claim 3, further comprising:

a first counter provided corresponding to each row of said row faulty bit storage memory for counting a faulty cell in a corresponding row, a second counter provided corresponding to each column of said column faulty bit storage memory for counting a faulty cell in a corresponding column, and processing means for determining repairability of a faulty cell in accordance with counts of the first and second counters when said faulty cell is detected.

6. The semiconductor test device according to claim 5, wherein said processing means includes means for determining the repairability, individually provided for each of the row faulty bit storage memory and said column faulty bit storage memory in conjunction with each other.

7. The semiconductor test device according to claim 5, wherein said processing means includes means coupled to the first and second counters, for determining whether the faulty row is to be replaced with said spare row circuit or the faulty column is to be replaced with said spare column circuit in accordance with the counts of the first and second counters.

8. The semiconductor test device according to claim 5, wherein said processing means includes means for fixing an address in a faulty bit storage memory provided corresponding to the spare circuit to be used, to an address of said faulty cell when a replacement is decided.

9. The semiconductor test device according to claim 7, wherein said processing means further includes means for, when the replacement is decided, fixing a faulty address of the faulty cell in the faulty bit storage memory provided corresponding to the spare circuit to be used among the row and column spare circuits and resetting information relating to the fixed faulty address in another faulty bit storage memory except information at a fixed address of said another faulty bit storage memory.

10. The semiconductor test device according to claim 8, wherein said processing means further includes means for determining whether the faulty cell of the semiconductor memory device under test can be repairable in accordance with a count of fixed addresses in the row and column faulty bit storage memories.

11. The semiconductor test device according to claim 8, wherein said processing means further includes means for individually determining whether detected faulty cell information is to be stored in each of the row and column faulty bit storage memories in accordance with the number of the fixed addresses.

12. The semiconductor test device according to claim 5, wherein said processing means includes a faulty row flag generator for setting a faulty row flag when the number of repaired faulty row(s) reaches the number of row(s) repairable by said spare row circuit, and a faulty column flag generator for setting a faulty column flag when the number of repaired faulty column(s) reaches the number of column (s) repairable by said spare column circuit, and means coupled to the faulty row flag generator and the faulty column flag generator for determining that the semiconductor memory device under test is irrepairable when the faulty row flag and the faulty column flag are both set, to complete the test.

13. The semiconductor test device according to claim 5, wherein said processing means is provided in common to the row faulty bit storage memory, the column faulty bit storage memory, the first counter and the second counter.

* * * * *